United States Patent
Karashima et al.

(10) Patent No.: US 8,297,488 B2
(45) Date of Patent: Oct. 30, 2012

(54) BUMP FORMING METHOD USING SELF-ASSEMBLING RESIN AND A WALL SURFACE

(75) Inventors: Seiji Karashima, Osaka (JP); Yasushi Taniguchi, Osaka (JP); Seiichi Nakatani, Osaka (JP); Kenichi Hotehama, Osaka (JP); Takashi Kitae, Osaka (JP); Susumu Sawada, Osaka (JP)

(73) Assignee: Panasonic Corporation, Osaka (JP)

( * ) Notice: Subject to any disclaimer, the term of this patent is extended or adjusted under 35 U.S.C. 154(b) by 574 days.

(21) Appl. No.: 12/282,774

(22) PCT Filed: Feb. 22, 2007

(86) PCT No.: PCT/JP2007/053863
§ 371 (c)(1),
(2), (4) Date: Sep. 12, 2008

(87) PCT Pub. No.: WO2007/122868
PCT Pub. Date: Nov. 1, 2007

(65) Prior Publication Data
US 2009/0078746 A1 Mar. 26, 2009

(30) Foreign Application Priority Data
Mar. 28, 2006 (JP) ................................. 2006-087032

(51) Int. Cl.
*B23K 31/00* (2006.01)
*B23K 31/02* (2006.01)
(52) U.S. Cl. ................ 228/248.1; 228/179.1; 228/233.2
(58) Field of Classification Search .. 228/179.1–180.22; 438/612, 613, 108
See application file for complete search history.

(56) References Cited

U.S. PATENT DOCUMENTS

| | | | | | |
|---|---|---|---|---|---|
| 4,791,006 | A | * | 12/1988 | Galvagni et al. | 427/282 |
| 4,918,277 | A | * | 4/1990 | Zimmer | 219/56.1 |
| 5,359,928 | A | * | 11/1994 | Blessington et al. | 101/128.4 |
| 5,361,695 | A | * | 11/1994 | Takagi et al. | 101/127 |
| 5,669,548 | A | * | 9/1997 | Miyake et al. | 228/224 |

(Continued)

FOREIGN PATENT DOCUMENTS

GB  2389460 A * 12/2003

(Continued)

OTHER PUBLICATIONS

Rito, M., et al., "Assembly Process by Electronically Conductive Adhesive Using Low Melting Point Fillers", 9th Symposium on "Microjoining and Assembly Technology in Electronics", Feb. 6-7, 2003, p. 115-120, Yokohama, Japan.

(Continued)

*Primary Examiner* — Kiley Stoner
*Assistant Examiner* — Carlos Gamino
(74) *Attorney, Agent, or Firm* — McDermott Will & Emery LLP

(57) ABSTRACT

A method for forming bumps 19 on electrodes 32 of a wiring board 31 includes the steps of: (a) supplying a fluid 14 containing conductive particles 16 and a gas bubble generating agent onto a first region 17 including the electrodes 32 on the wiring board 31; (b) disposing a substrate 40 having a wall surface 45 formed near the electrodes 32 for forming a meniscus 55 of the fluid 14, so that the substrate 40 faces the wiring board 31; and (c) heating the fluid 14 to generate gas bubbles 30 from the gas bubble generating agent contained in the fluid 14.

20 Claims, 19 Drawing Sheets

U.S. PATENT DOCUMENTS

| | | | |
|---|---|---|---|
| 5,868,302 A * | 2/1999 | Onishi et al. | 228/180.21 |
| 5,950,908 A * | 9/1999 | Fujino et al. | 228/248.1 |
| 6,099,935 A * | 8/2000 | Brearley et al. | 428/119 |
| 6,448,169 B1 * | 9/2002 | Brearley et al. | 438/612 |
| 6,584,897 B2 * | 7/2003 | Cobbley et al. | 101/127 |
| 6,609,652 B2 * | 8/2003 | MacKay et al. | 228/254 |
| 6,612,027 B2 * | 9/2003 | Akram | 29/843 |
| 6,909,180 B2 * | 6/2005 | Ono et al. | 257/734 |
| 6,910,615 B2 * | 6/2005 | Gruber et al. | 228/103 |
| 6,994,806 B2 * | 2/2006 | Nagai et al. | 252/514 |
| 7,007,833 B2 * | 3/2006 | Mackay et al. | 228/44.7 |
| 7,498,678 B2 * | 3/2009 | Gonzalez et al. | 257/778 |
| 7,531,385 B1 * | 5/2009 | Karashima et al. | 438/119 |
| 7,531,387 B1 * | 5/2009 | Karashima et al. | 438/127 |
| 7,537,961 B2 * | 5/2009 | Nakatani et al. | 438/108 |
| 2006/0108402 A1 * | 5/2006 | Crisp et al. | 228/248.1 |
| 2007/0001313 A1 * | 1/2007 | Fujimoto et al. | 257/778 |
| 2007/0216023 A1 * | 9/2007 | Nakatani et al. | 257/714 |
| 2007/0243664 A1 * | 10/2007 | Hirano et al. | 438/108 |
| 2007/0257362 A1 * | 11/2007 | Karashima et al. | 257/737 |
| 2008/0011402 A1 * | 1/2008 | Shiraishi et al. | 156/50 |
| 2008/0017995 A1 * | 1/2008 | Karashima et al. | 257/778 |
| 2008/0128664 A1 * | 6/2008 | Kitae et al. | 252/512 |
| 2008/0142966 A1 * | 6/2008 | Hirano et al. | 257/737 |
| 2008/0165518 A1 * | 7/2008 | Ichiryu et al. | 361/803 |
| 2008/0197173 A1 * | 8/2008 | Kitae et al. | 228/180.22 |
| 2008/0265437 A1 * | 10/2008 | Shiraishi et al. | 257/778 |
| 2008/0284046 A1 * | 11/2008 | Karashima et al. | 257/778 |
| 2009/0008776 A1 * | 1/2009 | Kitae et al. | 257/737 |
| 2009/0008800 A1 * | 1/2009 | Nakatani et al. | 257/778 |
| 2009/0023245 A1 * | 1/2009 | Kitae et al. | 438/108 |
| 2009/0085227 A1 * | 4/2009 | Shiraishi et al. | 257/778 |
| 2009/0102064 A1 * | 4/2009 | Sawada et al. | 257/778 |
| 2009/0115071 A1 * | 5/2009 | Karashima et al. | 257/778 |
| 2009/0117688 A1 * | 5/2009 | Karashima et al. | 438/108 |
| 2009/0133901 A1 * | 5/2009 | Karashima et al. | 174/250 |

FOREIGN PATENT DOCUMENTS

| | | |
|---|---|---|
| JP | 1-157796 | 6/1989 |
| JP | 6-125169 | 5/1994 |
| JP | 7-74459 | 3/1995 |
| JP | 2000-94179 | 4/2000 |
| JP | 2002-26070 | 1/2002 |
| JP | 2002-223065 | 8/2002 |
| JP | 2004-260131 | 9/2004 |
| JP | 2005-191132 | 7/2005 |
| WO | WO 2006/025387 A1 | 3/2006 |

OTHER PUBLICATIONS

Yasuda, M., et al., "Self-Organized Joining Assembly Process by Electrically Conductive Adhesive Using Low Melting Point Fillers," 10th Symposium on "Microjoining and Assembly Technology in Electronics", Feb. 5-6, 2004, p. 183-188, Yokohama, Japan.

Yasuda, K., et al., "Self-Organized Packaging using Polymer Containing Low-Melting-Point-Metal Filler—Process Simulation of Viscous Multi Phase Flow Fluid-", 11th Symposium on "Microjoining and Assembly Technology in Electronics", Feb. 3-4, 2005, p. 239-244, Yokohama, Japan.

Yamada, T., et al., "Self-organized Packaging by Polymer Containing Lowe Melting Point Metal—Experimental Verification of Process Rule Factors of Self-Organization-", 11th Symposium on "Microjoining and Assembly Technology in Electronics", Feb. 3-4, 2005, p. 245-250, Yokohama, Japan.

* cited by examiner (a)

| CONDUCTIVE PARTICLES | MELTING POINT (SOLIDUS) (°C) |
|---|---|
| Sn-58Bi | 139 |
| Sn-37Pb | 183 |
| Sn-9Zn | 199 |
| Sn-3.0Ag-0.5Cu | 217 |
| Sn-3.5Ag | 221 |
| Sn-0.7Cu | 228 |
| 12Sn-2.0Ag-10Sb-Pb | 240 |

FIG. 26

| GAS BUBBLE GENERATING AGENT | BOILING POINT (°C) | GAS BUBBLE GENERATING AGENT | BOILING POINT (°C) |
|---|---|---|---|
| HEXANE | 69 | DIMETHYLAMINE HYDROCHLORIDE | 171 |
| VINYL ACETATE | 72 | DIMETHYL SULFOXIDE (DMSO) | 189 |
| ISOPROPYL ALCOHOL | 83 | ETHYLENE GLYCOL | 198 |
| WATER | 100 | N-METHYL-2-PYRROLIDONE (NMP) | 204 |
| 1,4-DIOXANE | 101 | α-TERPINEOL | 218 |
| BUTYL ACETATE | 126 | BUTYL CARBITOL | 231 |
| PROPIONIC ACID | 141 | BUTYL CARBITOL ACETATE | 246 |

FIG. 27

| GAS BUBBLE GENERATING AGENT | DECOMPOSITION TEMPERATURE (°C) |
|---|---|
| BORIC ACID | 70~ |
| AMMONIUM METABORATE | 120~ |
| SODIUM HYDROGEN CARBONATE | 120-150 |
| 4,4'-OXYBIS (BENZENE SULFONYL HYDRAZIDE) (OBSH) | 155-165 |
| AZODICARBONAMIDE (ADCA) | 197-210 |
| BARIUM METABORATE | 200~ |
| N,N'-DINITROSO PENTAMETHYLENE TETRAMINE (DPT) | 200-250 |
| ALUMINUM HYDROXIDE | 230 |
| CALCIUM ALUMINATE | 230 |
| DAWSONITE | 230 |

BUMP FORMING METHOD USING SELF-ASSEMBLING RESIN AND A WALL SURFACE

RELATED APPLICATIONS

This application is the U.S. National Phase under 35 U.S.C. §371 of International Application No. PCT/JP2007/053863, filed on Feb. 22, 2007, which in turn claims the benefit of Japanese Application No. 2006-087032, filed on Mar. 28, 2006, the disclosures of which Applications are incorporated by reference herein.

TECHNICAL FIELD

The invention relates to a method for forming bumps on electrodes on a wiring board. The invention also relates to a bump forming apparatus.

BACKGROUND ART

In recent years, as semiconductor integrated circuits (LSIs) used in electronic equipments have become higher in density and degree of integration, electrode terminals of LSI chips have rapidly become higher in pin count and narrower in pitch. In order to mount such an LSI chip on a wiring board, flip chip mounting has been widely used for reduction in wiring delay. In the flip chip mounting, it is typical to form solder bumps on electrode terminals of an LSI chip and simultaneously bond the electrode terminals to electrodes formed on a wiring board via the solder bumps.

Conventionally, a plating method, a screen printing method, and the like have been developed as bump forming techniques. The plating method is suitable for a narrow pitch, but has a problem in productivity because of complicated process steps. The screen printing method is excellent in productivity, but is not suitable for a narrow pitch because of the use of a mask.

In such a situation, several techniques of selectively forming solder bumps on electrodes of an LSI chip and a wiring board have been developed recently. These techniques are not only suitable for formation of micro-bumps but also capable of simultaneously forming the bumps and therefore are also excellent in productivity. These techniques have thus drawn attention as techniques applicable to mounting of a next-generation LSI on a wiring board.

One of these techniques is a technique called a solder paste method (for example, Patent document 1). In this technique, a solder paste made of a mixture of solder powder and flux is applied on a substrate having electrodes formed on a surface thereof, and the solder powder is melted by heating the substrate, whereby solder bumps are selectively formed on the electrodes having high wettability.

In a technique called a super solder method (for example, Patent document 2), a paste-like composition (a chemical reaction deposition-type solder) containing an organic acid lead salt and metallic tin as main components is applied on a substrate having electrodes formed thereon, and a substitution reaction between Pb and Sn is caused by heating the substrate, whereby a Pb/Sn alloy is selectively deposited on the electrodes of the substrate.

In a technique called a super juffit method (for example, see Patent document 3), a substrate having electrodes formed on a surface thereof is immersed in an agent to form an adhesive coating only on the surfaces of the electrodes, the adhesive coating thus formed is brought into contact with a solder powder so that the solder powder adheres to the electrodes, and the substrate is then heated, whereby the melted solder is selectively formed on the electrodes.

Patent document 1: Japanese Laid-Open Patent Publication No. 2000-94179
Patent document 2: Japanese Laid-Open Patent Publication No. HEI 1-157796
Patent document 3: Japanese Laid-Open Patent Publication No. HEI 7-74459

DISCLOSURE OF THE INVENTION

Problems to be Solved by the Invention

The above-described solder paste methods were originally developed as a technique of selectively pre-coating solder on electrodes formed on a substrate, and have the following problems for application to bump formation required for flip chip mounting.

In the solder paste methods, a paste-like composition is supplied onto the substrate by coating, thereby causing local variations in thickness and concentration. Accordingly, the deposition amount of solder varies in each electrode and it is difficult to obtain uniform bumps. Moreover, in these methods, the paste-like composition is supplied by coating onto an uneven wiring board having electrodes formed on a surface thereof. It is therefore difficult to stably supply a sufficient amount of solder onto the electrodes that form projecting portions.

Moreover, the chemical reaction deposition-type solder material used in the super solder method uses a specific chemical reaction. Therefore, this method has a low degree of freedom in selection of solder composition and still has a problem with going to Pb-free.

On the other hand, the super juffit method is excellent in the following points: since the solder powder uniformly adheres to the electrodes, uniform bumps can be obtained; and because of a high degree of freedom in selection of solder composition, the method can easily go to Pb-free. However, the process of selectively forming an adhesive coating on the electrode surfaces, which is an essential process of the super juffit method, requires a special agent processing using a chemical reaction. This complicates the process and causes increase in cost. Therefore, this method still has a problem with application to a mass-production process.

The bump forming techniques, not only widely used techniques such as a plating method and a screen printing method but newly developed techniques, thus have problems. The inventors of the present application thought that developing a novel bump forming method regardless of the existing bump forming techniques eventually would lead to a highly potential technique and carried on research and development.

The invention is made in view of the above problems and it is an object of the invention to provide a bump forming method and a bump forming apparatus which are excellent in productivity.

Means for Solving the Problems

A bump forming method of the invention is a method for forming bumps on electrodes of a wiring board and is characterized in that the method includes the steps of: (a) supplying a fluid containing conductive particles and a gas bubble generating agent onto a first region including the electrodes on the wiring board; (b) disposing a substrate having a wall surface formed near the electrodes so that the substrate faces the wiring board; (c) heating the fluid to generate gas bubbles from the gas bubble generating agent contained in the fluid;

and (d) heating the fluid to melt the conductive particles contained in the fluid, wherein in the step (c), the fluid is self-assembled on the electrodes by the gas bubbles generated from the gas bubble generating agent, and in the step (d), the conductive particles contained in the fluid self-assembled on the electrodes are melted to form the bumps on the electrodes.

In a preferred embodiment, in the step (c), the fluid self-assembled on the electrodes is in contact with the wall surface to form a meniscus.

In a preferred embodiment, in the step (a), the first region to which the fluid is supplied is a partial region of the wiring board.

In a preferred embodiment, the substrate has a protrusion formed on a surface facing the wiring board, and the wall surface is present on at least a part of a side surface of the protrusion.

In a preferred embodiment, the substrate has a recess formed in a surface facing the wiring board, and the wall surface is an inner wall of the recess.

In a preferred embodiment, the recess has a bottom surface adjacent to the inner wall, and in the step (b), the fluid is in contact with the wall surface and the bottom surface.

In a preferred embodiment, the substrate is formed by a wall-surface forming member including the wall surface, and a ceiling member extending approximately perpendicularly from the wall surface of the wall-surface forming member.

In a preferred embodiment, the ceiling member is slidable along the wall surface of the wall-surface forming member, and at least one of the steps (b) and (c) includes the step of varying a gap between the ceiling member and the wiring board.

In a preferred embodiment, the wall surface has a pillar shape on the substrate, and in the step (b), the substrate is disposed so as to face the wiring board so that the pillar-shaped wall surface is positioned over the electrodes.

In a preferred embodiment, the pillar-shaped wall surface has a smaller width than that of the electrodes.

In a preferred embodiment, a plurality of electrodes are arranged in an array on the wiring board, a plurality of pillar-shaped wall surfaces are formed in an array on the substrate, and in the step (b), the substrate is disposed so as to face the wiring board so that the wall surfaces formed in the array are respectively positioned over the electrodes.

In a preferred embodiment, the bump forming method further includes the steps of: (e) removing the substrate after the step (d); and (f) remelting the bumps formed on the electrodes.

In a preferred embodiment, a plurality of electrodes are arranged on the wiring board, the wall surface has a pillar shape on the substrate, and in the step (b), the substrate is disposed so as to face the wiring board so that the wall surface is positioned between adjacent electrodes.

In a preferred embodiment, a plurality of electrodes are arranged in an array on the wiring board, the wall surface has a grid-like shape on the substrate, and in the step (b), the substrate is disposed so as to face the wiring board so that the wall surface surrounds a periphery of each electrode.

In a preferred embodiment, a plurality of electrodes are arranged in an array on the wiring board, the wall surface is formed by an inner surface of a cross-shaped recess formed in a surface of the substrate, and in the step (b), the substrate is disposed so as to face the wiring board so that corners of the cross-shaped recess are positioned near the electrodes arranged at corners of the array.

In a preferred embodiment, the substrate is a light-transmitting substrate. The light-transmitting substrate is preferably a glass substrate.

In a preferred embodiment, the substrate is a substrate having poor wettability to the conductive particles.

In a preferred embodiment, the gas bubble generating agent contained in the fluid is made of a material that boils or a material that is thermally decomposed to generate a gas when the fluid is heated in the step (c).

In a preferred embodiment, in the step (c), the gas bubbles generated from the gas bubble generating agent are discharged to outside from a periphery of a space provided between the substrate and the wiring board.

In a preferred embodiment, the bump forming method further includes the step of removing the substrate after the step (d).

A bump forming apparatus of the invention is an apparatus for forming bumps on electrodes of a wiring board by the above bump forming method and is characterized in that the apparatus includes: a stage on which the wiring board is to be placed; a holding portion for holding a substrate having a wall surface; and a heater for heating the stage or the holding portion, wherein a fluid containing conductive particles and a gas bubble generating agent is supplied onto a first region including the electrodes on the wiring board placed on the stage, the substrate held by the holding portion is disposed so as to face the wiring board so that the wall surface is positioned near the electrodes, the fluid is heated by the heater so that the fluid is self-assembled on the electrodes by gas bubbles generated from the gas bubble generating agent contained in the fluid, and the fluid is further heated by the heater so that the conductive particles contained in the fluid self-assembled on the electrodes are melted to form the bumps on the electrodes.

Effects of the Invention

According to the bump forming method of the invention, a fluid containing conductive particles and a gas bubble generating agent is supplied onto a first region including electrodes on a wiring board, and a substrate having a wall surface formed near the electrodes for forming a meniscus of the fluid is then disposed so as to face the wiring board. The fluid is then heated to generate gas bubbles from the gas bubble generating agent. Bumps can therefore be selectively formed in the first region. Especially, heating the fluid and thereby generating gas bubbles from the gas bubble generating agent enables the conductive particles to be self-assembled on the electrodes. As a result, a highly productive bump forming method can be provided.

BRIEF DESCRIPTION OF THE DRAWINGS

FIG. 25 is a diagram showing materials of conductive particles according to an embodiment of the invention;

FIG. 26 is a diagram showing materials of a gas bubble generating agent according to an embodiment of the invention; and FIG. 27 is a diagram showing materials of a gas bubble generating agent according to an embodiment of the invention.

Figure 1:
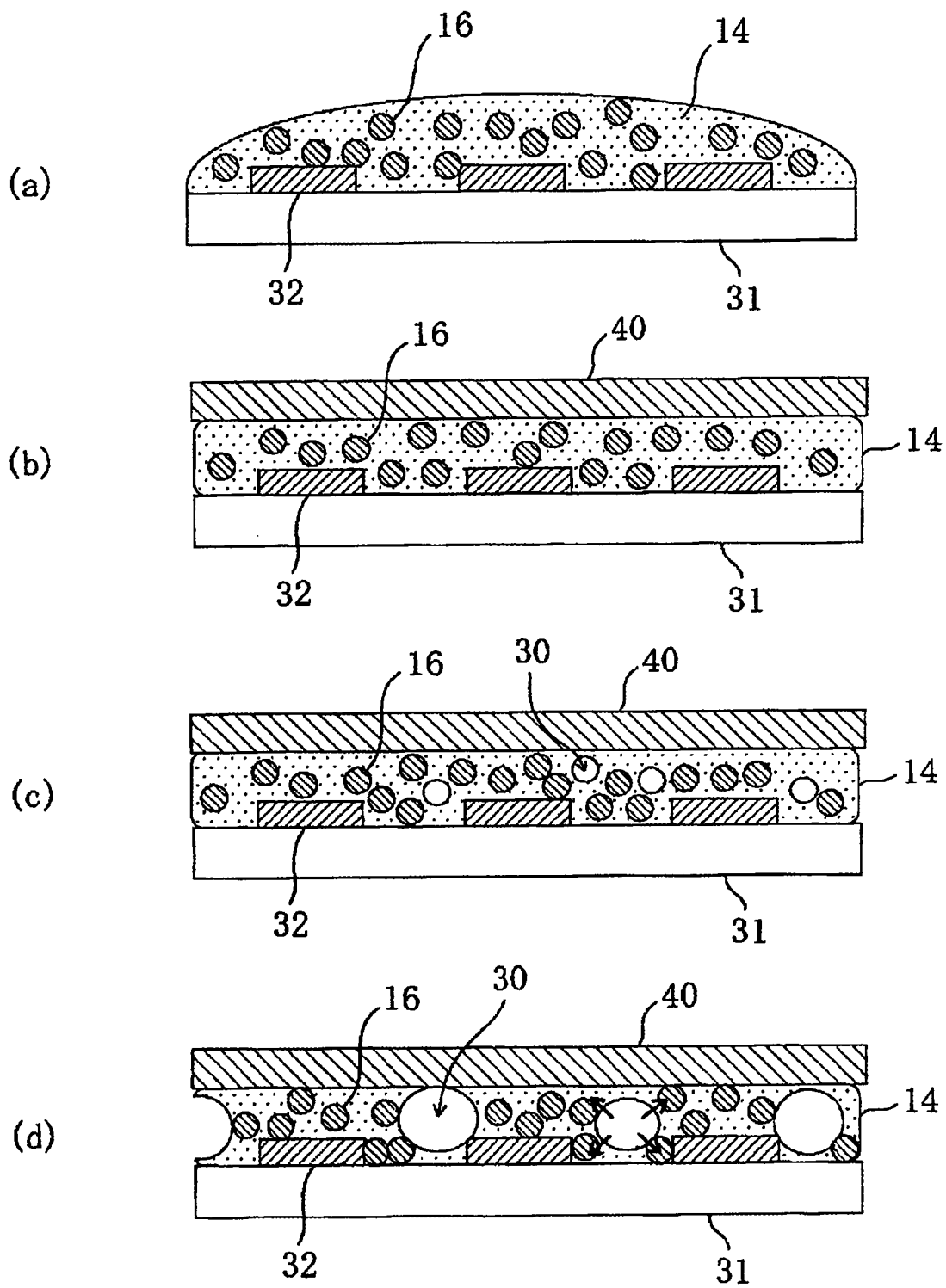
FIGS. 1(a) through 1(d) are process cross-sectional views showing a basic process of a bump forming method using self-assembly of a resin.

DESCRIPTION OF THE REFERENCE NUMERALS 14 fluid
16 conductive particle
17 region
19 bump
30 gas bubble
31 wiring board
32 electrode
32e wiring
40 substrate
41 ceiling plane
42 protrusion
43 recess
45 wall surface
47 bottom surface
49 ceiling member
55 meniscus
60 bump forming apparatus
61 stage
63 heater

BEST MODE FOR CARRYING OUT THE INVENTION

The applicant of the present application has suggested a novel bump forming method and a novel flip chip mounting method (Japanese Patent Application Nos. 2004-257206, 2004-365684, and 2005-094232) after making various studies of a bump forming method for forming bumps by self-assembling conductive particles (for example, solder powder) on electrodes of a wiring board, semiconductor chip, or the like, or a flip chip mounting method for performing flip chip mounting by self-assembling conductive particles between respective electrodes of a wiring board and a semiconductor chip and forming a connection body between the electrodes. Note that these patent applications are herein incorporated by reference.

FIGS. 1(a) through 1(d) and FIGS. 2(a) through 2(d) are diagrams illustrating a basic process of a bump forming method disclosed by the applicant of the present application in the specifications of the above patent applications.

First, as shown in FIG. 1(a), a resin 14 containing solder powder 16 and a gas bubble generating agent (not shown) is supplied onto a wiring board 31 having a plurality of electrodes 32. Then, as shown in FIG. 1(b), a flat plate 40 is placed on a surface of the resin 14.

By heating the resin 14 in this state, as shown in FIG. 1(c), gas bubbles 30 are generated from the gas bubble generating agent contained in the resin 14. Then, as shown in FIG. 1(d), the resin 14 is pushed outside the gas bubbles 30 by growth of the generated gas bubbles 30.

Figure 2:
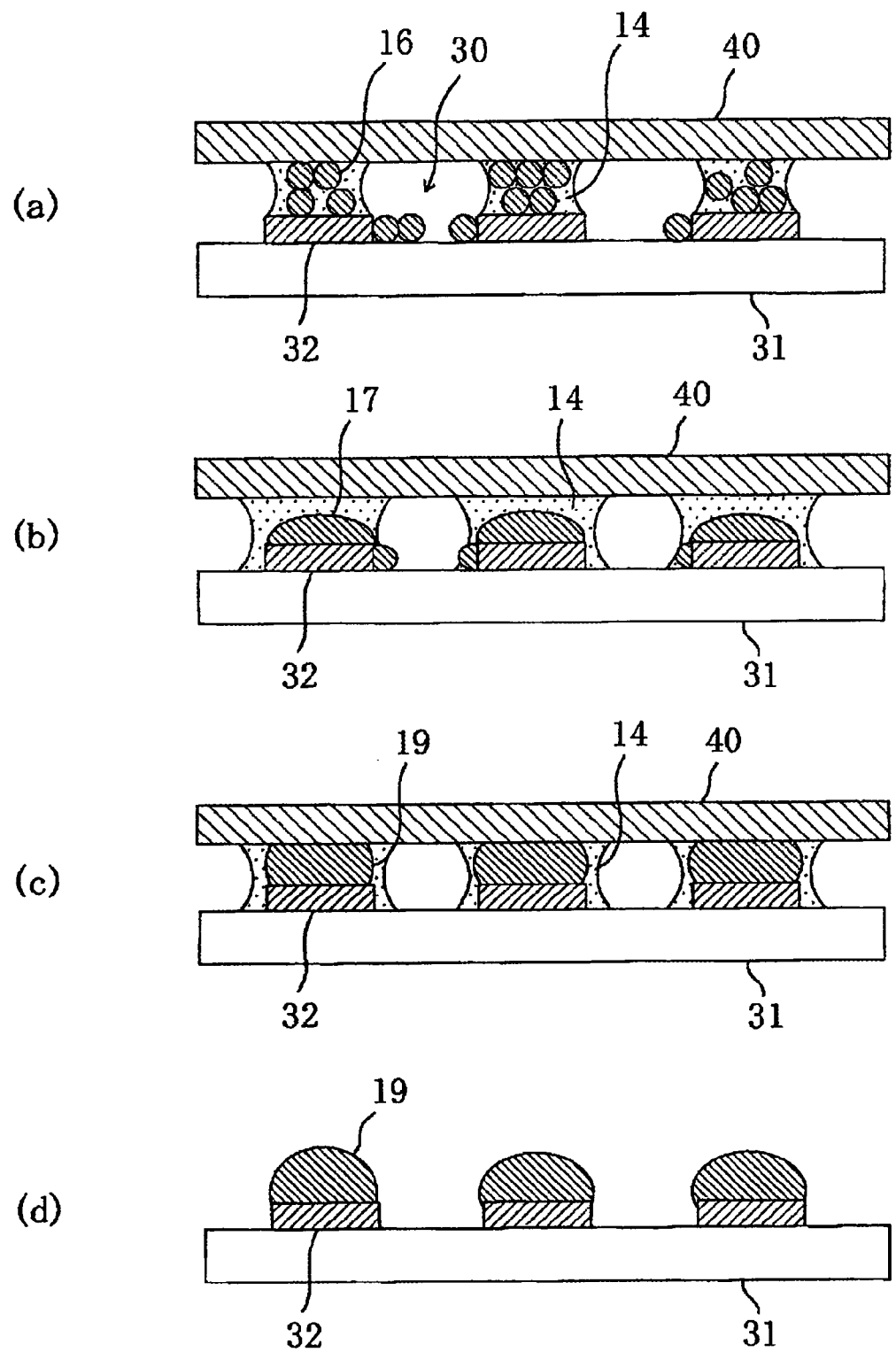
FIGS. 2(a) through 2(d) are process cross-sectional views showing a basic process of a bump forming method using self-assembly of a resin.

As shown in FIG. 2(a), the resin 14 thus pushed out is self-assembled into a columnar shape at the interface with the electrodes 32 of the wiring board 31 and the interface with the flat plate 40. Then, by further heating the resin 14, as shown in FIG. 2(b), the solder powder 16 contained in the resin 14 is melted, whereby particles of the solder powder 16 contained in the resin 14 self-assembled on the electrodes 32 are melt-bonded together.

Since the electrodes 32 have high wettability to the melt-bonded solder powder 16, bumps 19 made of molten solder powder are formed on the electrodes 32 as shown in FIG. 2(c). Finally, as shown in FIG. 2(d), the resin 14 and the flat plate 40 are removed, whereby the wiring board 31 having the bumps 19 formed on the electrodes 32 is obtained.

This method is characterized in that, by heating the resin 14 supplied to the space between the wiring board 31 and the flat plate 40, gas bubbles 30 are generated from the gas bubble generating agent, and the resin 14 is pushed outside the gas bubbles 30 by the growth of the gas bubbles 30 so that the resin 14 is self-assembled between the electrodes 32 of the wiring board 31 and the flat plate 40.

Figure 3:
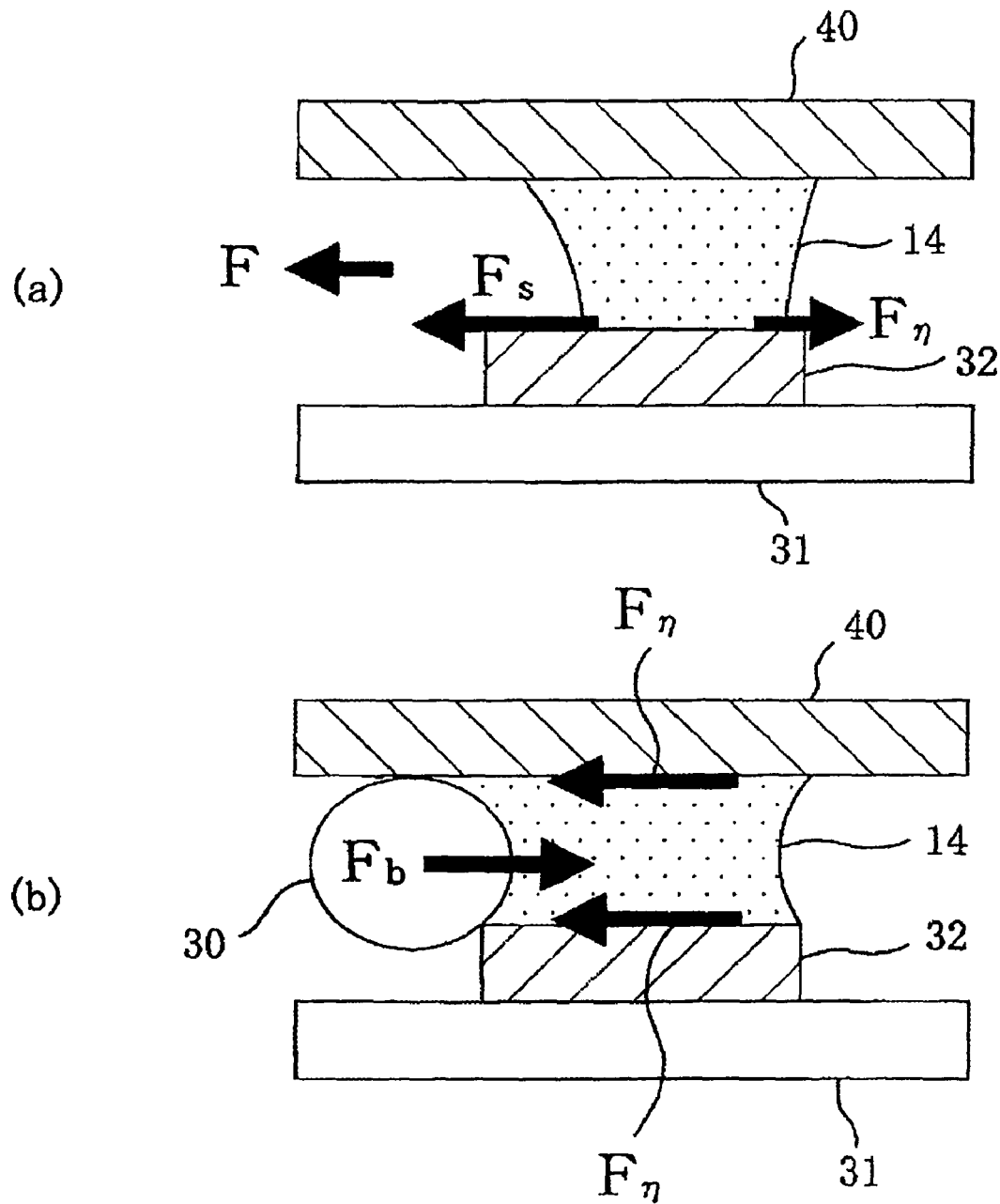
FIGS. 3(a) and 3(b) are diagrams illustrating a mechanism of self-assembly of a resin.

It can be considered that the phenomenon that the resin 14 is self-assembled on the electrodes 32 is caused by the mechanism shown in FIGS. 3(a) and 3(b).

FIG. 3(a) is a diagram showing the state of the resin 14 pushed onto an electrode 32 of the wiring board 31 by the grown gas bubbles (not shown). The resin 14 that is in contact with the electrode 32 has a larger interfacial tension (a force resulting from so-called wet-spreading of a resin) Fs at the interface therebetween than a stress Fη generated from the viscosity η of the resin. Therefore, the resin 14 spreads over the whole surface of the electrode 32, and a columnar resin having boundaries at the ends of the electrode 32 is finally formed between the electrode 32 and the flat plate 40.

Note that, as shown in FIG. 3(b), a stress Fb generated by the growth (or movement) of the gas bubbles 30 is applied to the columnar resin 14 formed by self-assembly on the electrode 32. However, the columnar resin 14 can retain its shape by the stress Fη generated by the viscosity η of the resin 14. Therefore, the resin 14 once self-assembled does not disappear.

Whether the self-assembled resin 14 can retain a constant shape or not depends not only on the above interfacial tension Fs but on the area S of the electrode 32 and the distance L of the space between the electrode 32 and the flat plate 40, and the viscosity η of the resin 14. Provided that T is a reference value that enables the resin 14 to retain a constant shape, it is considered that the following relation is satisfied qualitatively:

$$T = K \cdot (S/L) \cdot \eta \cdot Fs \text{ (K is a constant)}.$$

As described above, this method forms the resin 14 on the electrodes 32 in a self-aligned manner by using self-assembly of the resin 14 by the interfacial tension. However, since the electrodes 32 are formed as protrusions on the surface of the wiring board 31, it can be said that such self-assembly by the interfacial tension uses a phenomenon that occurs on the electrodes 32 where the gap between the wiring board 31 and the flat plate 40 is narrowed.

By using the above method proposed by the applicant of the present application, the solder powder dispersed in the resin can be efficiently self-assembled on the electrodes, and uniform, highly productive bump formation can be implemented. Moreover, since the solder powder dispersed in the resin can be equally self-assembled on the plurality of electrodes on the substrate having the resin supplied thereon. Therefore, the above method is especially useful when bumps are simultaneously formed on all the electrodes on the wiring board having the resin supplied thereon.

During further study of the above method, the applicant of the present application observed a certain phenomenon when forming bumps on a partial region of a wiring board. This phenomenon will now be described.

Depending on the structure of the wiring board, bumps may need to be formed only on the electrodes on a part of the wiring board. For example, in a wiring board 31 of FIG. 4, bumps are formed on electrodes 32 that are the tips of wirings.

Figure 4:
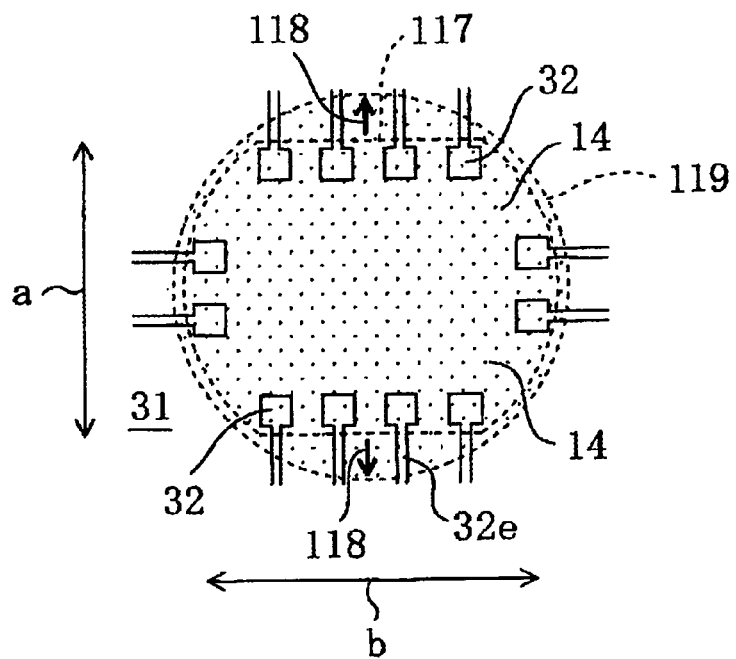
FIG. 4 is a top view illustrating an example in which bumps are formed in a partial region of a wiring board.

In the case of the wiring board of FIG. 4, a resin 14 containing solder powder and a gas bubble generating agent (not shown) is applied to a region 117 including electrodes 32. By heating the applied resin 14, bumps are formed on the electrodes 32 in the region 117 in a self-assembled manner. In this case, however, as shown in FIG. 4, a phenomenon was found that the resin 14 and the solder powder move to a region 119 other than the region 117 and the solder wet-spreads not only in the range of the electrodes 32 but in the range of wirings 32e to form assembly of the solder powder on the wirings 32e. There was also a case in which the solder powder was deviated assembled due to a slight difference in balance. Note that, in FIG. 4, dimension a is about 1 mm and dimension b is about 1.25 mm.

Figure 5:
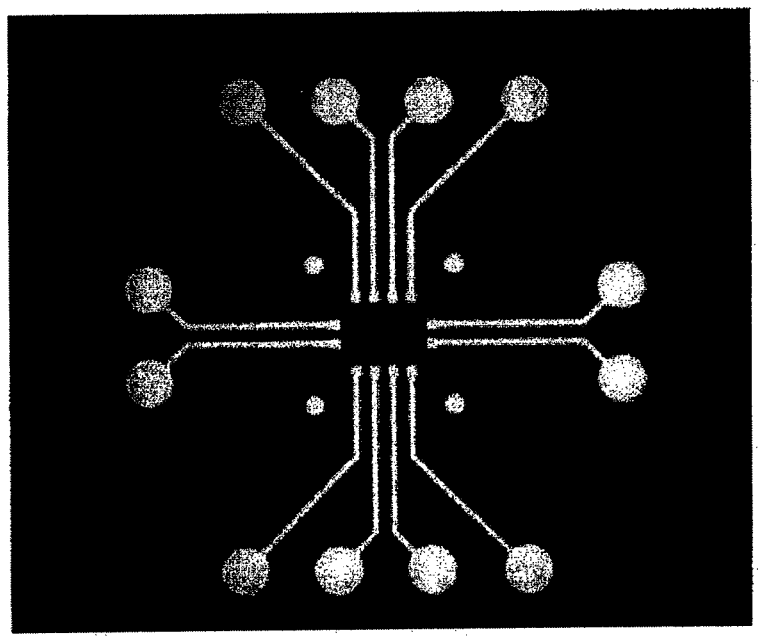
FIG. 5 is a microphotograph illustrating a wiring pattern in an example of performing bump formation in a partial region.
Figure 6:
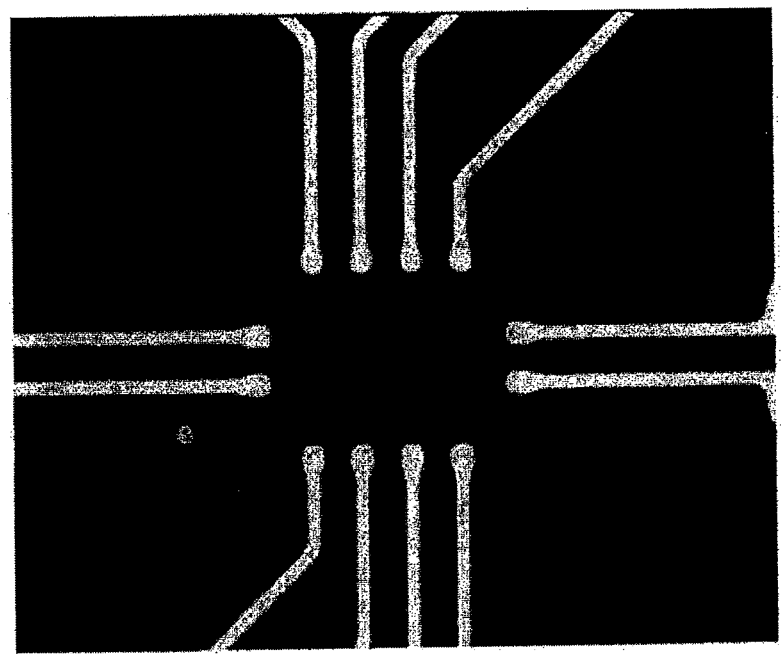
FIG. 6 is a microphotograph illustrating a wiring pattern in an example of performing bump formation in a partial region.

Moreover, description will be given to the case where bumps are to be formed on twelve electrodes (lands) in the center of a wiring pattern as shown in FIG. 5. Note that FIG. 6 shows another example of the wiring pattern having a central portion shown in FIG. 5.

Figure 7:
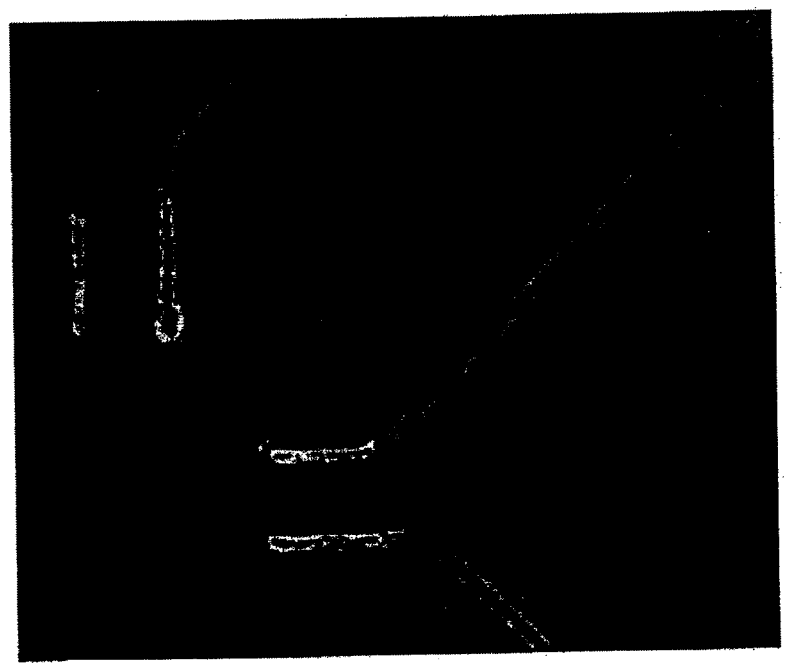
FIG. 7 is a microphotograph illustrating an example in which movement of a resin was observed.
Figure 8:
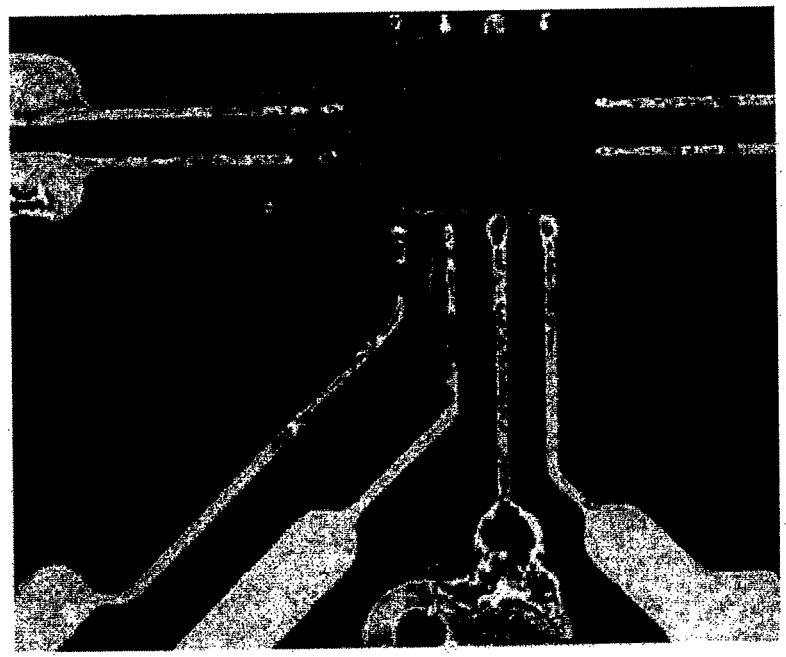
FIG. 8 is a microphotograph illustrating an example in which movement of a resin was observed.
Figure 9:
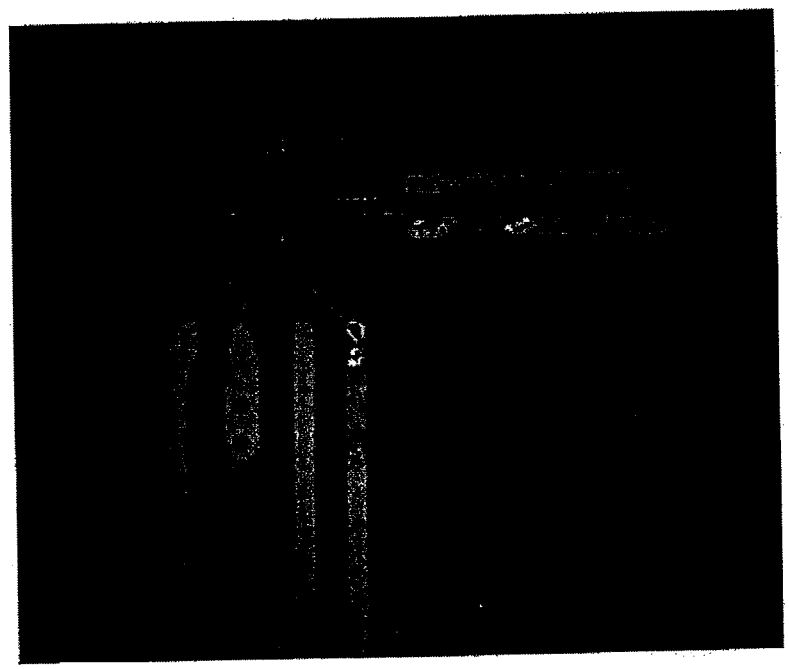
FIG. 9 is a microphotograph illustrating an example in which movement of a resin was observed.
Figure 10:
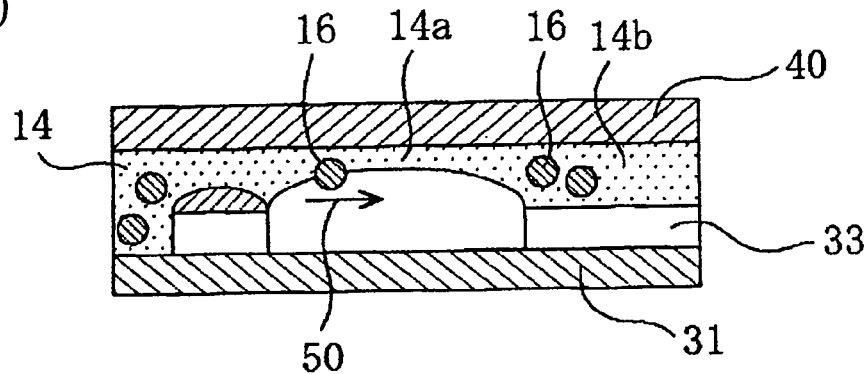
FIG. 10 is a diagram illustrating a resin moving means in bump formation.

In this case, the inventors of the present application observed the following phenomenon: first, as shown in FIG. 7, there was an example in which a solder bump spread beyond a land portion. As shown in FIGS. 8 and 9, there was also an example in which solder powder was assembled at a position that does not relate to the land portion. Such assembly of the solder powder at an unrelated position occurred probably based on the following movement of the resin 14: as shown in FIG. 10, the resin 14 moved along the flat plate 40 to another location (see resin 14a, 14b and arrow 50) and the solder powder 16 moved onto an electrode on which bump formation was not intended. A phenomenon that the resin flowed between wirings to a distant place and the solder powder moved accordingly was observed in some cases.

It is possible to find such bump formation conditions that can limit movement of the resin 14 within a predetermined region on a case-by-case basis by experiments or the like and strictly control the conditions, or to mask the substrate other than a predetermined region. However, both methods impair the simplicity of the above bump forming method.

The inventors of the present application arrived at the invention after keenly studying a method capable of forming solder bumps in a simple manner not only when the resin (fluid) 14 containing the solder powder 16 and the gas bubble generating agent is applied to the whole surface of the wiring board but when this resin 14 is applied to a partial region of the wiring board.

Hereinafter, embodiments of the invention will be described with reference to the accompanying drawings. For simplification of description, elements having substantially the same function are denoted by the same reference numerals and characters throughout the figures shown below. The invention is not limited to the embodiments described below.

FIGS. 11(a) and 11(b) are process cross-sectional views illustrating a bump forming method according to an embodiment of the invention. FIG. 11(a) is a top perspective view and FIG. 11(b) is a side cross-sectional view. Note that, in an example shown in FIG. 11(a), a wiring board including the same pattern of electrodes 32 as that shown in FIG. 4 is used for easy understanding of description.

The bump forming method of this embodiment is a method for forming bumps on electrodes 32 on a wiring board 31.

First, a fluid 14 containing conductive particles and a gas bubble generating agent is supplied onto a first region 17 including electrodes 32 on a wiring board 31. In this embodiment, the fluid 14 is a resin. Note that specific examples of the conductive particles 16 and the gas bubble generating agent will be described later.

Next, as shown in FIGS. 11(a) and 11(b), a substrate 40 having a wall surface 45 formed thereon is disposed so as to face the wiring board 31. The wall surface 45 is positioned near the electrodes 32 so that a meniscus 55 of the fluid 14 can be formed.

In the structure of this embodiment, a substrate (plate-like member) 40 has a protrusion 42 formed on a surface 41 facing the wiring board 31, and the wall surface 45 for forming a meniscus 55 of the fluid 14 is present on at least a part of the side surface of the protrusion 42.

A "meniscus" herein means that the surface of a liquid is curved at a position close to a wall surface due to a surface tension (or interfacial tension). In this embodiment, a "meniscus" means that the fluid 14 is in contact with the wall surface 45 (in this example, at least a part of a side surface of the protrusion 42) and a surface of the fluid 14 is curved due to a surface tension (or interfacial tension) of the fluid 14.

In the illustrated example, a meniscus of the fluid 14 is formed by the fluid 14 being in contact with both the wall surface 45 and a part of the surface 41 (ceiling plane) adjacent to the wall surface 45. However, a meniscus is formed even when the fluid 14 is not in contact with the ceiling plane 41. A meniscus is also formed even when the fluid 14 is in contact with a part of the side surface of the protrusion 42 instead of the whole side surface of the protrusion 42.

As can be understood from FIG. 11(b), the fluid 14 is attracted toward the wall surface 45 by the interfacial tension with the wall surface 45. The fluid 14 can be retained within a predetermined region (first region 17) by this force.

The first region 17 is often a partial region of the wiring board 31, but may be the whole (or approximately the whole) region of the wiring board 31. Note that the first region 17 is typically a region that is the same as or slightly larger than a region where bumps are to be formed. The first region 17 typically corresponds to the region where bumps are to be formed, and the fluid 14 is supplied to the first region 17. Therefore, the first region 17 is not limited by the area, shape, and the like, but is determined by the wiring pattern and the electrode (land) layout.

Figure 11:
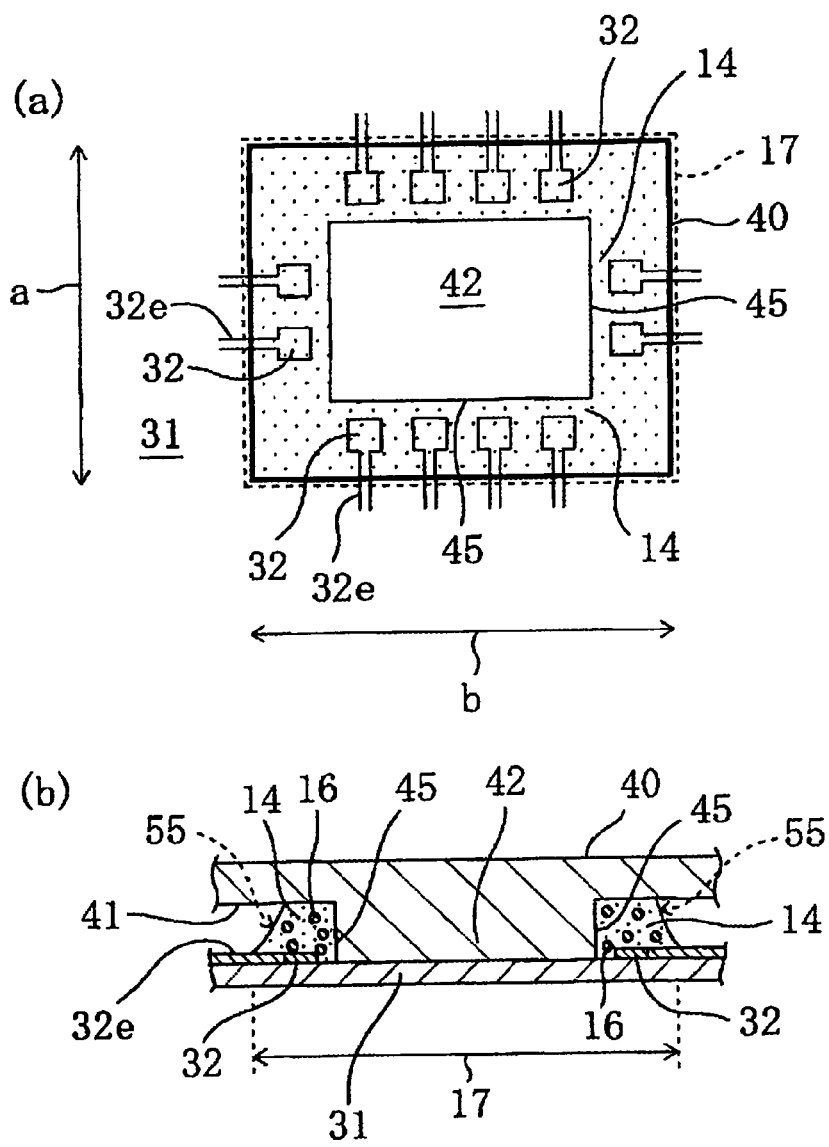
FIGS. 11(a) and 11(b) are a process top view and a process cross-sectional view showing a bump forming method according to an embodiment of the invention, respectively.

For example, in the case where the region 17 shown in FIG. 11 is the first region 17, the first region 17 is a region corresponding to dimension a by dimension b. For example, the first region 17 is a region of 1 mm by 1.25 mm or a region having an area about the same as 1 mm by 1.25 mm. In the illustrated structural diagram, the region where the protrusion 42 is present may be included in the first region 17 or may be excluded from the first region 17 for convenience.

The dimensions and shape of the substrate 40 and the dimensions, height, and shape of the protrusion 42 can be specifically determined on a case-by-case basis according to the bump formation conditions. Note that, in one example of this embodiment, the substrate 40 has a 1 cm by 1 cm square shape, and the protrusion 42 has a 0.65 mm by 0.9 mm rectangular shape. The height of the protrusion 42 is not specifically limited as long as an appropriate meniscus 55 can be formed. It should be noted that the above-mentioned values and the like are exemplary only and the invention is not limited to the above dimensions and shapes.

By heating the fluid 14 in the state shown in FIGS. 11(a) and 11(b), gas bubbles are generated from the gas bubble generating agent contained in the fluid 14. The gas bubbles thus generated from the gas bubble generating agent cause the conductive particles 16 to be self-assembled onto the electrodes 32.

According to the bump forming method of this embodiment, the fluid 14 containing the conductive particles 16 and the gas bubble generating agent is first supplied onto the first region 17 including the electrodes 32 on the wiring board 31. The substrate 40 having the wall surface 45 provided near the electrodes 32 for forming a meniscus 55 of the fluid 14 is then disposed so as to face the wiring board 31. Thereafter, the fluid 14 is heated, whereby gas bubbles are generated from the gas bubble generating agent. Bumps can therefore be selectively formed within the first region 17. Especially, by heating the fluid 14 to generate gas bubbles from the gas bubble generating agent, the conductive particles 16 can be self-assembled on the electrodes 32. A highly productive bump forming method can therefore be implemented.

Hereinafter, the bump forming method of this embodiment will be described in further detail with reference to FIGS. 12(a) through 12(c) and FIGS. 13(a) through 13(d). FIGS. 12(a) through 12(c) and FIGS. 13(a) through 13(d) are process cross-sectional views illustrating the bump forming method of this embodiment.

First, as shown in FIG. 12(a), the fluid 14 containing the conductive particles 16 and the gas bubble generating agent (not shown) is supplied onto the first region 17 including the electrodes 32 on the wiring board 31. A resin wiring board (for example, an FR-4 substrate), a ceramic substrate, or the like can be used as the wiring board 31. Not only a rigid substrate but a flexible substrate can be used.

Next, as shown in FIG. 12(b), the substrate 40 having the wall surface 45 for forming a meniscus of the fluid 14 is disposed so as to face the wiring board 31. By positioning the wall surface 45 near the electrodes on which bumps are to be formed (within a distance that allows meniscus formation), a meniscus of the fluid 14 is formed by using an interfacial tension of the wall surface 45 and the fluid 14 can thus be retained on the electrodes 32 by the interfacial tension of the wall surface 45. In other words, in the state shown in FIG. 12(b), the electrodes 32 are located around the wall surface 45. The fluid 14 gathered around the wall surface 45 by the interfacial tension of the wall surface 45 is therefore positioned on the electrodes 32 and retained thereon.

In this embodiment, the protrusion 42 that forms the wall surface 45 is set on the wiring board 31. A bottom surface 47 of the protrusion 42 may be in contact with the top surface of the wiring board 31, or the fluid 14 may be interposed between the bottom surface 47 of the protrusion 42 and the top surface of the wiring board 31.

When the substrate 40 having the wall surface 45 is disposed, the fluid 14 is pressed by the protrusion 42 of the substrate 40. The fluid 14 is therefore set so as to be in contact with the wall surface 45 and to surround the outside of the wall surface 45. Note that the fluid 14 may be supplied after the substrate 40 having the wall surface 45 formed thereon is disposed over the wiring board 31. In this case, the fluid 14 may be supplied so that the fluid 14 is located around the wall surface 45.

In this embodiment, the substrate (plate-like member) 40 is, for example, a glass substrate. Not only a glass substrate, but a ceramic substrate or a semiconductor substrate (such as a silicon substrate) may be used. Using a light-transmitting substrate (a glass substrate and a ceramic substrate) as the substrate 40 is advantageous in that confirmation of the progress of a process and confirmation of bump formation are facilitated. In the case of using a silicon substrate, transmission observation can be performed by using infrared rays.

When a ceramic substrate is used, thermal conductivity can be improved over the case where a glass substrate, for example, is used. It is also preferable to use a substrate having excellent flatness and capable of being easily processed (for example, a semiconductor substrate, a ceramic substrate, and a glass substrate) as the substrate 40. The more inexpensive the substrate 40 is, the more advantageous it becomes in terms of the cost of the manufacturing process.

Preferably, a substrate having poor wettability to the conductive particles 16 is used as the substrate 40. In addition to a glass substrate, a ceramic substrate, and a semiconductor substrate, a chromium substrate can be used as such a substrate, even though it is a metal substrate. Even if a body of the substrate has excellent wettability to the conductive particles 16 (for example, a metal substrate such as a copper substrate or an aluminum substrate), the wettability to the conductive particles 16 can be adjusted by coating the substrate surface.

By heating the fluid 14 in the state shown in FIG. 12(b), gas bubbles 30 are generated from the gas bubble generating agent contained in the fluid 14, as shown in FIG. 12(c). In this embodiment, heating of the fluid 14 is performed with the fluid 14 being retained in the first region 17 by the interfacial tension of the wall surface 45 of the substrate 40. In the illustrated example, heating of the fluid 14 is performed with the fluid 14 being located on the electrodes 32. In this embodiment, the substrate 40 can be fixed by positioning the bottom surface 47 of the protrusion 42 on the wiring board 31. The distance between the electrodes 32 and the ceiling plane 41 of the substrate 40 can thus be kept constant. Note that the constant space between the electrodes 32 and the ceiling plane 41 is larger than the particle size of the conductive particles 16.

Figure 12:
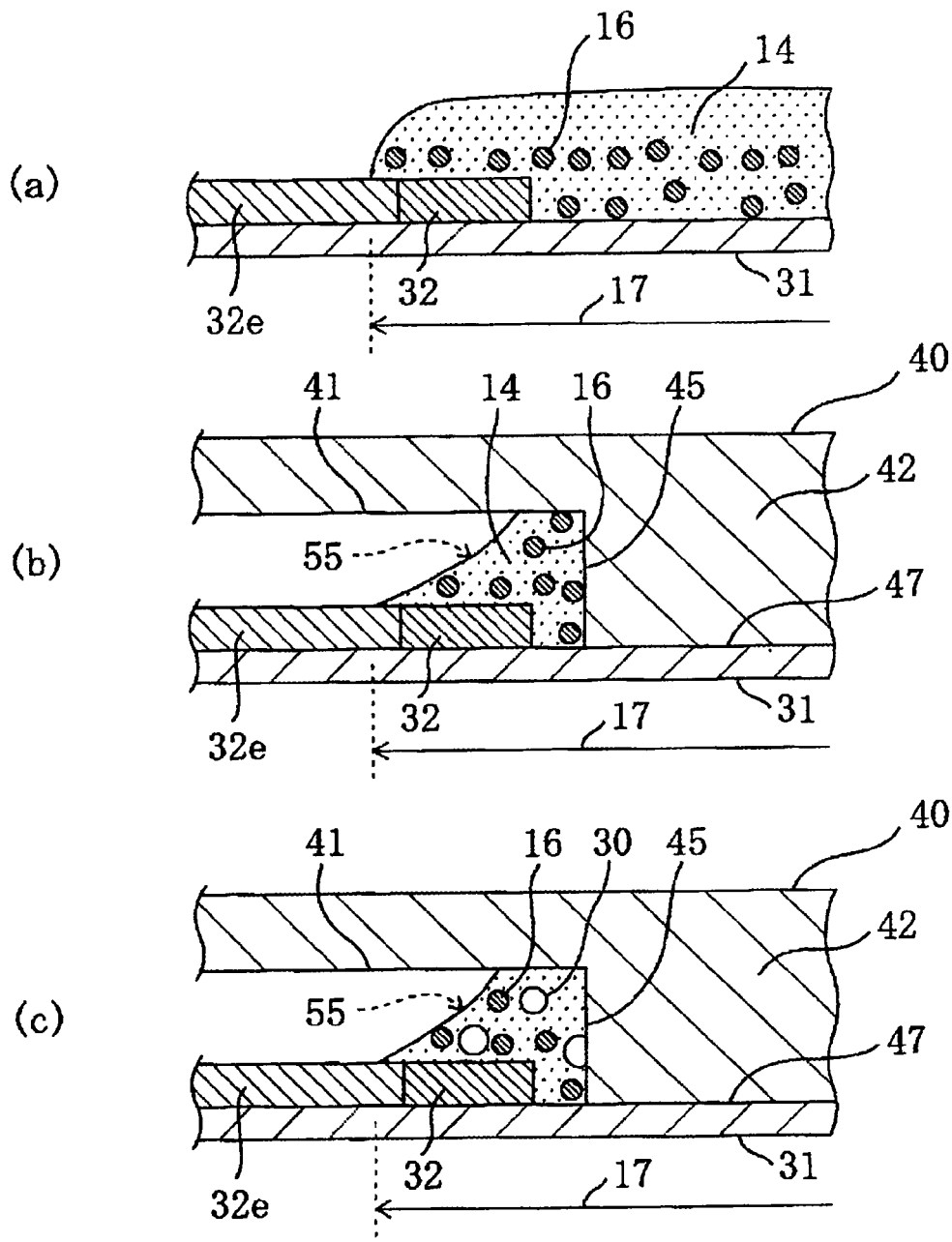
FIGS. 12(a) through 12(c) are process cross-sectional views showing a bump forming method according to an embodiment of the invention.

According to this embodiment, as shown in FIGS. 12(*b*) and 12(*c*), since the wall surface 45 is formed on the substrate 40, the fluid 14 supplied to the first region 17 can be retained in the first region 17 by the interfacial tension between the fluid 14 and the wall surface 45. In other words, since the fluid 14 is retained in the first region 17, the fluid 14 does not spread largely beyond the first region 17. As a result, an effective process capable of performing local bump formation in a simple manner is implemented.

Hereinafter, a process after generation of the gas bubbles 30 will be described with reference to FIGS. 13(*a*) through 13(*d*).

Figure 13:
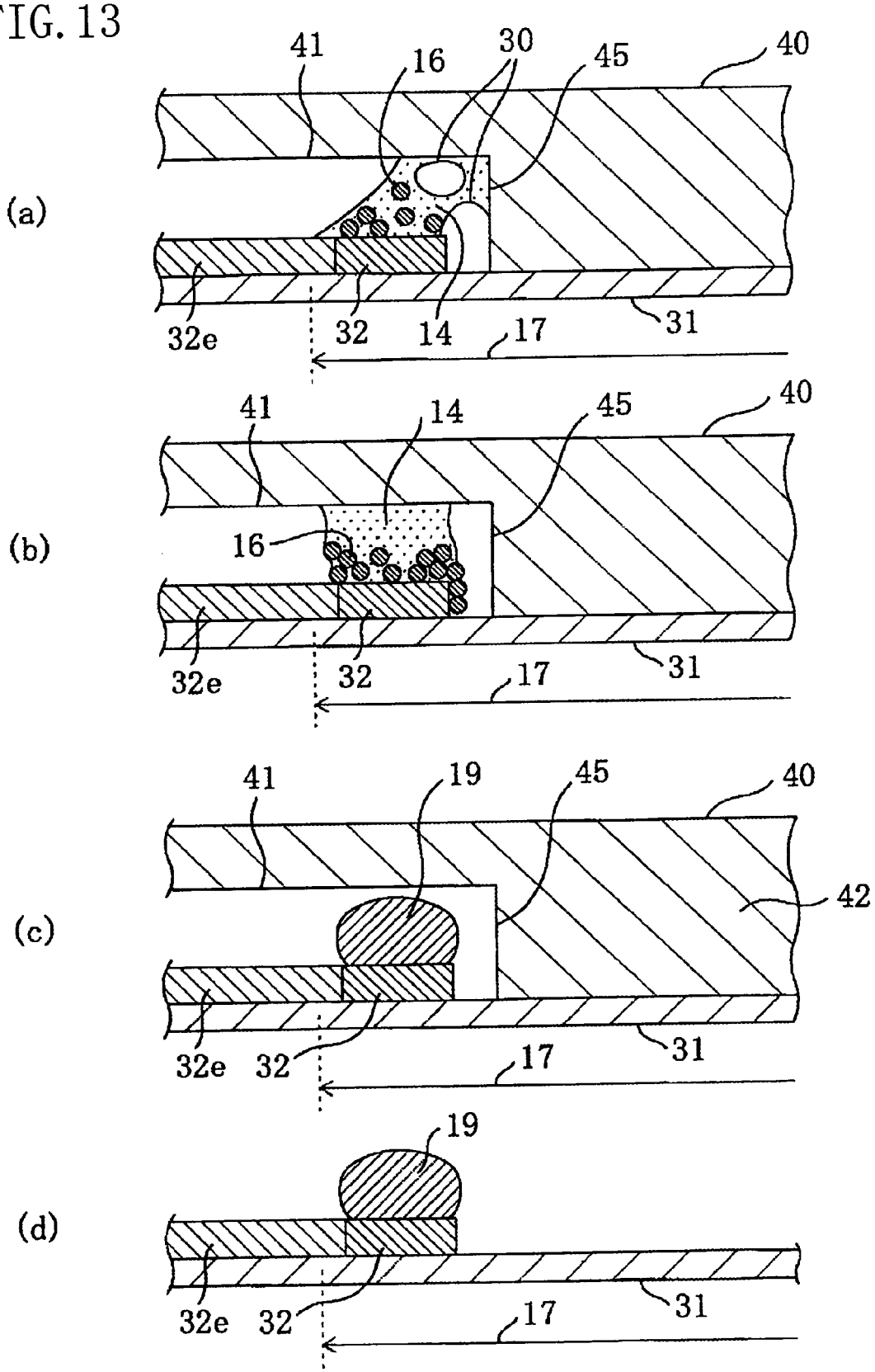
FIGS. 13(a) through 13(d) are process cross-sectional views showing a bump forming method according to an embodiment of the invention.

As shown in FIG. 13(*a*), the fluid 14 is pushed out by the gas bubbles 30 as the generated gas bubbles 30 grow. Note that the gas bubbles 30 generated from the gas bubble generating agent in the fluid 14 are discharged to the outside from a periphery of the space provided between the substrate 40 and the wiring board 31.

As shown in FIG. 13(*b*), the fluid 14 thus pushed out assembles at the interface with the electrodes 32 of the wiring board 31. In the illustrated example, the fluid 14 assembles into a columnar shape at the interface between the substrate 40 and the electrodes 32. Note that the assembling state of the fluid 14 may vary according to the growth of the gas bubbles 30. The fluid 14 may assemble into a columnar shape at the interface between the electrodes 32 and the ceiling plane 41 or may assemble into a columnar shape at the interface between the electrodes 32 and the wall surface 45.

With the self-assembly of the fluid 14, the conductive particles 16 in the fluid 14 assemble onto the electrodes 32. Then, by further heating the fluid 14, as shown in FIG. 13(*c*), the conductive particles 16 contained in the fluid 14 are melted, whereby self-assembly of the conductive particles 16 is completed. In other words, bumps 19 made of the melted conductive particles are formed on the electrodes 32.

Note that, depending on the conditions, a bump formation process may be performed so that the height of the bumps 19 reaches the ceiling plane 41 of the substrate 40. In this case, by moving the substrate 40 in an up-down direction by an appropriate amount after the bumps are formed, variation in height of the formed bumps 19 can be suppressed. This can improve parallelism upon, for example, metal bonding in the flip chip mounting which is performed after bump formation, whereby connection reliability can be improved.

Finally, as shown in FIG. 13(*d*), the substrate 40 is removed, whereby the wiring board 31 having the bumps 19 formed on the electrodes 32 is obtained. The fluid 14 may also be removed together with the removal of the substrate 40.

Note that the fluid (resin) 14 may be left after the substrate 40 is removed. After the bumps are formed, however, fine conductive particles (solder powder) may remain on the fluid 14 as a residue. Therefore, it is also preferable in view of reliability to remove the fluid 14 together with the residue, as shown in FIG. 13(*d*).

As described above, in the bump forming method of this embodiment, the wall surface 45 for forming a meniscus 55 of the fluid 14 is placed near the electrodes 32, and the fluid 14 can be retained on the first region 17 by the interfacial tension of the wall surface 45. Accordingly, when the fluid 14 is heated and the gas bubbles 30 are generated from the gas bubble generating agent, the fluid 14 can be prevented from moving beyond the first region 17 to a region other than the first region 17.

As a result, when the bumps 19 are to be selectively formed within the first region 17, it is not necessary to remove afterward the solder powder 16 moved to a region other than the first region 17 and to provide a mask in advance. As a result, the bumps can be reliably selectively formed by a simple method.

Moreover, since the fluid 14 can be actively retained within the first region 17 by the interfacial tension, conditions for selectively forming the bumps 19 within the first region 17 are relaxed, and the degree of freedom of the process conditions is increased.

Moreover, in the method of this embodiment, the fluid 14 is pushed outside the gas bubbles by the growth of the gas bubbles 30, whereby the fluid 14 can be self-assembled on the electrodes 32 in the first region 17. Thereafter, by melting the conductive particles 16 contained in the fluid 14 self-assembled on the electrodes 32, the bumps 19 made of the melted conductive particles can be formed on the electrodes 32 in a self-aligned manner. In this way, the conductive particles 16 dispersed in the fluid 14 can be efficiently self-assembled on the electrodes 32, whereby bumps having excellent uniformity and high productivity can be formed on the electrodes.

Referring back to FIGS. 11(*a*) and 11(*b*), in the structure of this embodiment, the fluid 14 can be retained in the first region 17 by the wall surface 45 of the substrate 40, unlike the example of FIG. 4. The bumps 19 will therefore be reliably formed on the electrodes (lands) 32 in a self-assembled manner, unlike the example of FIG. 4.

In other words, in the structure of this embodiment, the fluid 14 is retained within the region 17 by the surface tension (interfacial tension) of the wall surface 45. Therefore, the conductive particles can be prevented from assembling to the locations of wirings 32*e* or assembling to a part of an electrode pattern in a region other than the first region 17, and short-circuit can thus be prevented from being caused by such assembling of the conductive particles.

As described above, in the method of this embodiment, the fluid 14 containing the conductive particles 16 is pushed outside the gas bubbles by the growth of the gas bubbles 30, whereby the fluid 14 is assembled into a columnar shape on the electrodes 32. By melting the conductive particles 16 contained in the assembled fluid 14, the bumps 19 made of the melted conductive particles 16 can be formed on the electrodes 32 in a self-aligned manner.

Accordingly, even in the case where self-assembly on the electrodes could not be successfully implemented by merely using wettability, the bumps 19 made of the melted conductive particles 16 can be formed on the electrodes 32 in a self-assembled manner by the method of this embodiment. Moreover, since the conductive particles 16 can be efficiently self-assembled on the electrodes 32, required bumps 19 can be formed on the electrodes 32 with an appropriate amount of conductive particles 16, that is, without having an excessive amount of conductive particles 16 contained in the fluid 14.

Hereinafter, examples of the experimental results of the bump forming method of this embodiment will be described with reference to FIGS. 14 and 15.

Figure 14:
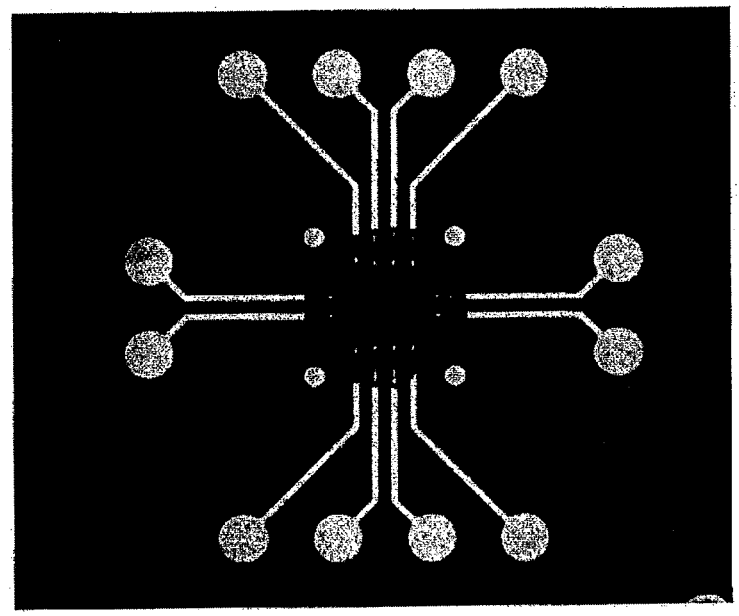
FIG. 14 is a microphotograph showing an experimental result of bump formation.

FIG. 14 is an image showing the result of applying the method of this embodiment to a wiring board having the wiring pattern shown in FIG. 5. As shown also in FIG. 5, this wiring pattern has twelve electrodes (lands) arranged in the center.

As shown in FIG. 14, according to the method of this embodiment, the fluid 14 is held in the first region 17 by a meniscus 55 caused by the interfacial tension of the wall surface 45. As a result, bumps were able to be reliably formed on the twelve electrodes (lands).

Figure 15:
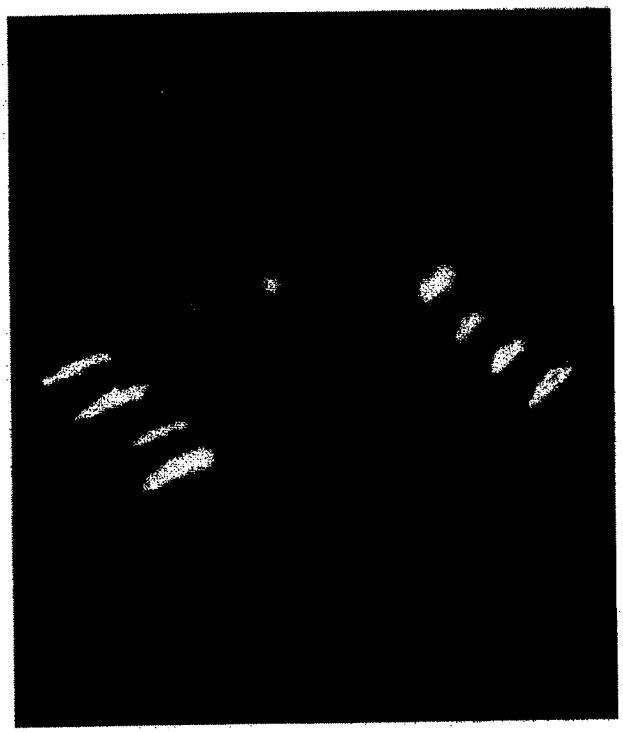
FIG. 15 is a microphotograph showing an experimental result of bump formation.

Note that FIG. 15 is a perspective view also showing the result of applying the method of this embodiment. It can be confirmed from FIG. 15 that bumps having such a height that can be practically used as bumps were reliably formed on the electrodes (lands).

Figure 16:
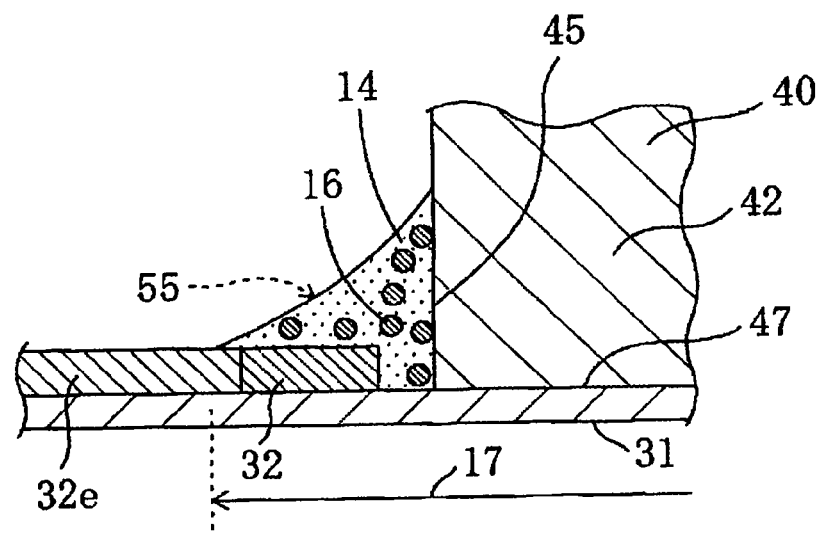
FIG. 16 is a step cross-sectional view showing a bump forming method according to an embodiment of the invention.

As shown in FIG. 16, the height of the plane where the wall surface 45 is present in the substrate 40 may be increased so that a part of that plane (for example, the side surface of the protrusion 42) can be used as a wall surface 45 capable of forming a meniscus 55. Even when the height of the plane where the wall surface 45 is present is high, a meniscus 55 is formed according to the interfacial tension with the wall surface 45, gravity, and property (such as viscosity) of the fluid 14.

In the above example, the wall surface 45 capable of forming a meniscus 55 of the fluid 14 is positioned inside the electrodes 32 (on the center side) within the first electrode 17. However, the structure of this embodiment is not limited to this.

Figure 17:
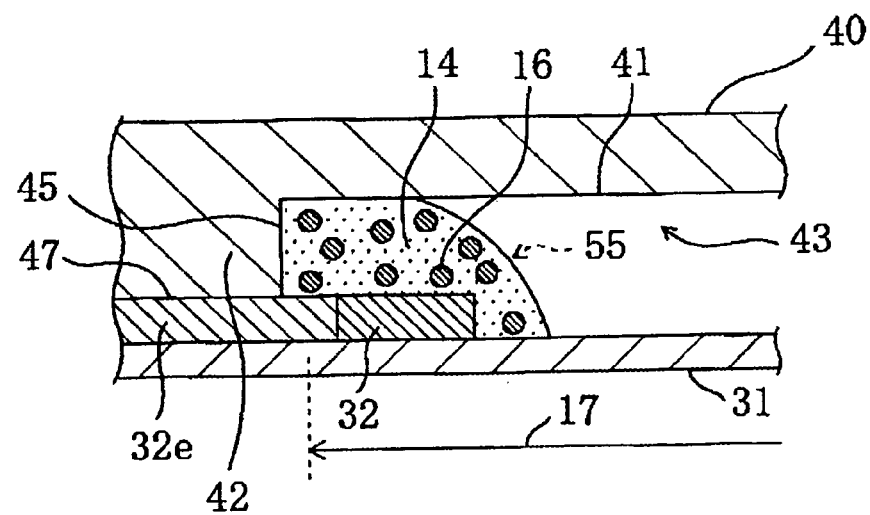
FIG. 17 is a step cross-sectional view showing a bump forming method according to an embodiment of the invention.

For example, as shown in FIG. 17, the wall surface 45 may be positioned outside the electrodes 32 (on the outer edge side). Note that, in this case as well, the wall surface 45 may be present on at least a part of the side surface of the protrusion 42 of the substrate 40. Alternatively, a recess 43 may be formed in the substrate 40 and an inner wall of the recess 43 may be used as the wall surface 45.

In the example of FIG. 17, a bottom surface adjacent to the inner wall 45 of the recess 43 serves as the ceiling plane 41, and the fluid 14 is in contact with the inner wall 45 and the bottom surface (ceiling plane) 41 to form a meniscus 55.

In the above example, the wall surface 45 is provided so as to extend perpendicularly (or approximately perpendicularly) to the wiring board 31. However, as long as a meniscus 55 of the fluid 14 can be formed an the fluid 14 can be retained in a predetermined region by the interfacial tension of the wall surface 45, the wall surface 45 is not limited to extend perpendicularly, but may alternatively be tilted (for example, ±30°).

Moreover, the substrate 40 of this embodiment is not limited to a substrate made of a single member or material. The substrate 40 may alternatively be formed by the protrusion 42 that serves as a wall-surface forming member including the wall surface 45, and a ceiling member (a member including the ceiling plane 41) extending approximately perpendicularly (for example, 90°) from the wall surface 45 of the protrusion 42. A support member capable of supporting the protrusion 42 that serves as a wall-surface forming member may further be provided.

In addition, the ceiling member may be slidable with respect to the wall-surface forming member. In the structure shown in FIG. 18(a), the ceiling member 49 is slidable along the protrusion 42.

In other words, the ceiling member 49 can be moved up and down. The ceiling member 49 can be moved down by, for example, a pressing means provided on the ceiling member 49. The ceiling member 49 can be moved up by, for example, lifting the ceiling member 49 by using a member capable of sucking the ceiling member 49. In addition to this method, the ceiling member 49 can be moved up and down by a preferred method as appropriate.

Figure 18:
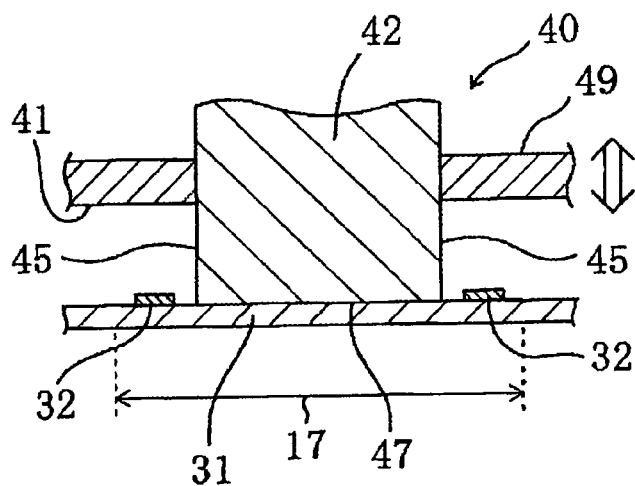
FIGS. 18(a) through 18(c) are process cross-sectional views showing a bump forming method according to an embodiment of the invention.
Figure 18:
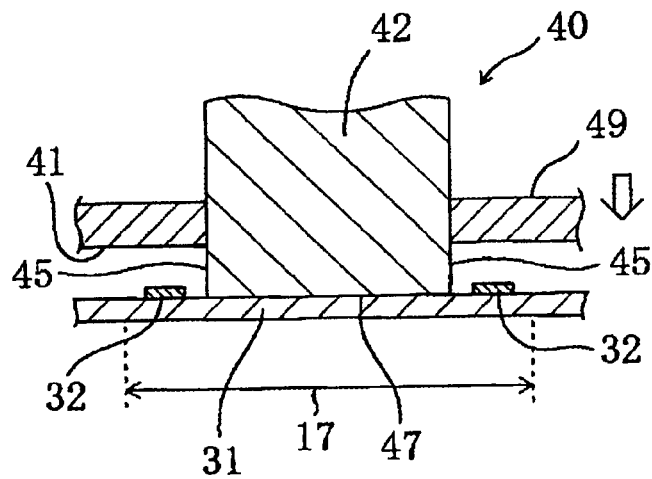
Figure 18:
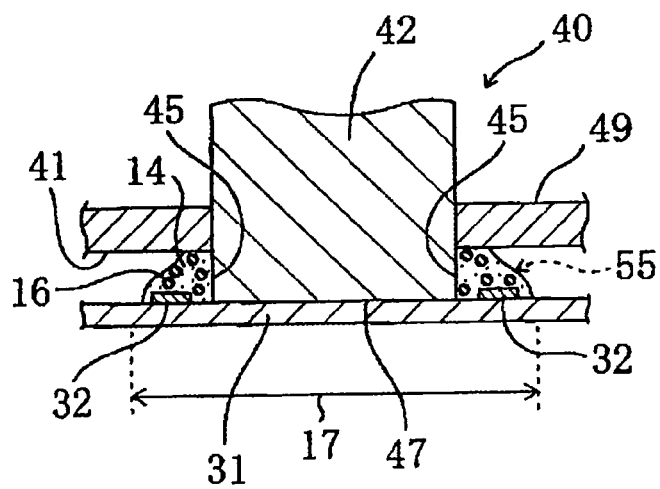

FIG. 18(b) shows a structure in which the ceiling member 49 is lowered from the state of FIG. 18(a). When the fluid 14 containing the conductive particles 16 and the gas bubble generating agent (not shown) is supplied onto the electrodes 32 (in the first region 17) in the structure of FIG. 18(b), a meniscus 55 of the fluid 14 is formed by the wall surface 45, and the state shown in FIG. 18(c) is obtained.

Note that the fluid 14 may be supplied before the protrusion 42 is set on the wiring board 31, so that the fluid 14 is pushed out by the bottom surface 47 of the protrusion 42 and the state shown in FIG. 18(c) is obtained.

Thereafter, by heating the fluid 14, the bumps 19 are formed on the electrodes 32 in a self-assembled manner through the steps described above. During heating of the fluid 14, the distance (gap) between the ceiling plane 41 of the ceiling member 49 and the electrodes 32 may be varied by moving the ceiling member 49 up and down. Formation of a meniscus 55 and the height of the bumps 19 to be formed can be adjusted by such variation of the distance.

Figure 19:
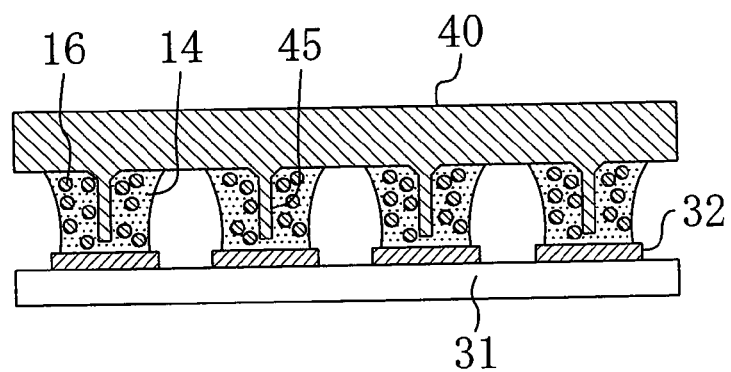
FIG. 19(a) is a step cross-sectional view showing a bump forming method according to an embodiment of the invention.
FIG. 19(b) is a plan view thereof.
Figure 19:
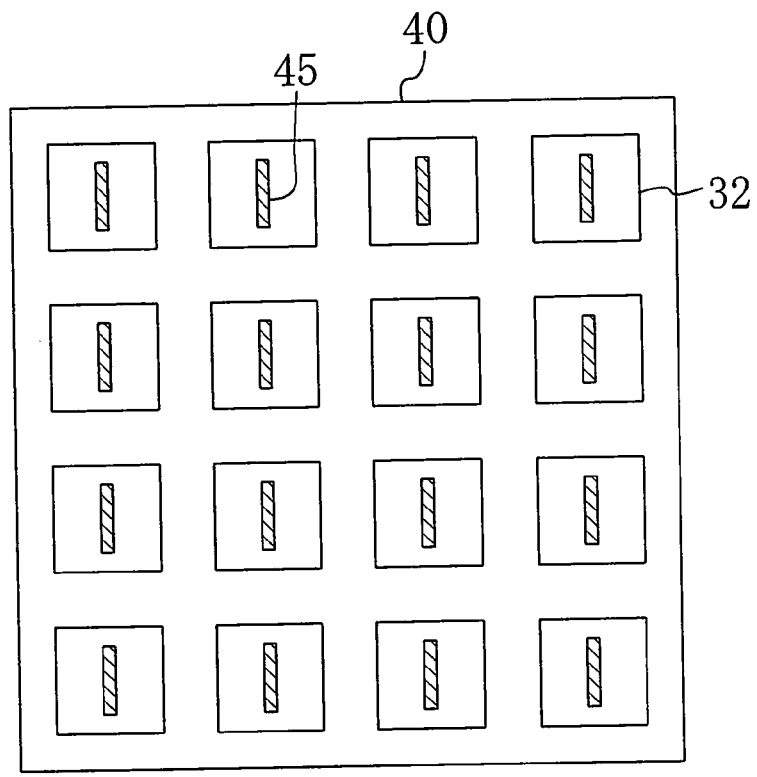

Moreover, the wall surface 45 provided on the substrate 40 of this embodiment may have a pillar-shaped structure as shown in FIGS. 19(a) and 19(b). FIG. 19(a) is a cross-sectional view showing the step of disposing the substrate 40 having the wall surface 45 so that the substrate 40 faces the wiring board 31. FIG. 19(b) is a plan view thereof.

As shown in FIG. 19(a), the wall surface 45 having a pillar shape is formed on the substrate 40. The substrate 40 is disposed so as to face the wiring board 31 so that the pillar-shaped wall surface 45 is positioned over the electrodes 32. The width of the pillar-shaped wall surface 45 is smaller than that of the electrode 32.

As shown in FIG. 19(b), in the case where a plurality of electrodes 32 are arranged in an array on the wiring board 31, a plurality of pillar-shaped wall surfaces 45 may be formed in an array on the substrate 40. In this case, the substrate 40 is disposed so as to face the wiring board 31 so that the wall surfaces 45 formed in an array are respectively positioned over the electrodes 32.

In this embodiment, as shown in FIG. 19(a), the wall surface 45 capable of forming a meniscus is provided on both sides of the approximately central line of each electrode 32. A meniscus of the fluid 14 can therefore be formed by both surfaces of the pillars of the wall surfaces 45. Accordingly, when gas bubbles are generated from the gas bubble generating agent by heating the fluid 14, the fluid 14 can be more effectively prevented from spreading to a region other than the electrodes 32.

By thus positioning the pillar-shaped wall surfaces 45 over the electrodes 32, the self-assembling property of the fluid 14 can be improved. This structure is therefore effective especially when the electrodes 32 have a low height (for example, electrodes formed on a glass substrate for use in COG (Chip on Glass)).

The shape of the pillar (protrusion) formed on the surface of the substrate 40 in order to form the wall surface 45 is not specifically limited. For example, however, in the case where the pillar has a plate shape extending along one side of the respective electrode 32 as shown in FIG. 19(b), the fluid 14 can be more effectively prevented from spreading to a region other than the electrodes 32.

Note that, in the bump forming method of this embodiment, bumps are formed on the electrodes 32 by melting the conductive particles 16 contained in the fluid 14 self-assembled on the electrodes 32. When the substrate 40 is removed after formation of the bumps, the bumps formed on the electrodes 32 have a recess at the position where the wall surface 45 was located. In this case, if necessary, the bumps having no recess can be obtained by remelting the bumps formed on the electrodes 32 after removing the substrate 40.

The method of this embodiment can be applied even when the electrodes 32 are not arranged in an array as shown in FIG. 19(b).

Figure 20:
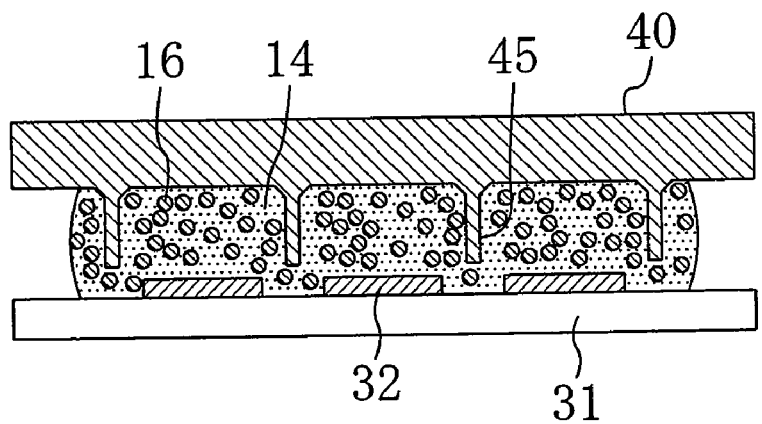
FIG. 20(a) is a step cross-sectional view showing a bump forming method according to an embodiment of the invention.
FIG. 20(b) is a plan view thereof.
Figure 20:
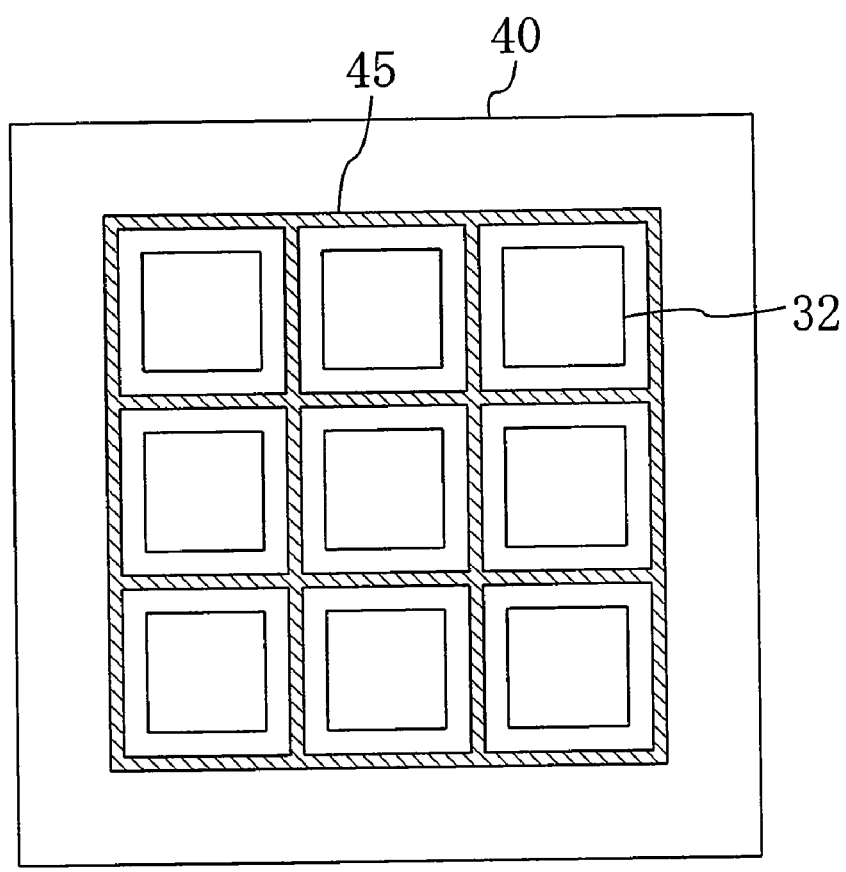

The pillar-shaped wall surface 45 may alternatively be structured as shown in FIGS. 20(a) and 20(b). FIG. 20(a) is a cross-sectional view of the step of disposing the substrate 40 having the wall surface 45 so that the substrate 40 faces the wiring board 31. FIG. 20(b) is a plan view thereof.

As shown in FIG. 20(a), the wall surface 45 having a pillar shape is formed on the substrate 40. The substrate 40 is disposed so as to face the wiring board 31 so that the wall surface 45 is positioned between adjacent electrodes 32.

As shown in FIG. 20(b), in the case where a plurality of electrodes 32 are arranged in an array on the wiring board 31, the pillar-shaped wall surface 45 may have a grid-like shape on the substrate 40. In this case, the substrate 40 is disposed so as to face the wiring board 31 so that the wall surface 45 surrounds the periphery of each electrode 32.

In this embodiment, as shown in FIG. 20(a), the wall surface 45 capable of forming a meniscus is provided between adjacent electrodes 32. A meniscus of the fluid 14 can therefore be formed over adjacent electrodes 32 by both surfaces of the pillar of the wall surface 45. Accordingly, when gas bubbles are generated from the gas bubble generating agent by heating the fluid 14, the fluid 14 can be effectively prevented from spreading to adjacent electrodes 32.

By thus positioning the pillar-shaped wall surface 45 between adjacent electrodes 32, the self-assembly property of the fluid 14 can be improved. This structure is therefore effective especially when the electrodes 32 have a low height (for example, electrodes formed on a glass substrate for use in COG (Chip on Glass)).

The shape of the pillar (protrusion) formed on the surface of the substrate 40 to form the wall surface 45 is not specifically limited. For example, in the case where the electrodes 32 are arranged in an array on the wiring board 31, the pillar-shaped wall surface 45 has a grid-like shape in FIG. 20(b). However, the pillar of the wall surface 45 may alternatively be separated along each side of the electrodes 32.

Note that, in the bump forming method of this embodiment, the bumps does not have such a recess as that of the bumps formed by the method of FIGS. 19(a) and 19(b). The step of remelting the bumps is therefore not required after the substrate 40 is removed. Alternatively, the substrate 40 may be disposed with respect to the wiring board 31 so that the pillar-shaped wall surface 45 surrounds the periphery of a plurality of electrodes 32 (for example, electrodes arranged in a 2 by 2 array).

The method of this embodiment can be applied even when the electrodes 32 are not arranged in an array as shown in FIG. 20(b).

Figure 21:
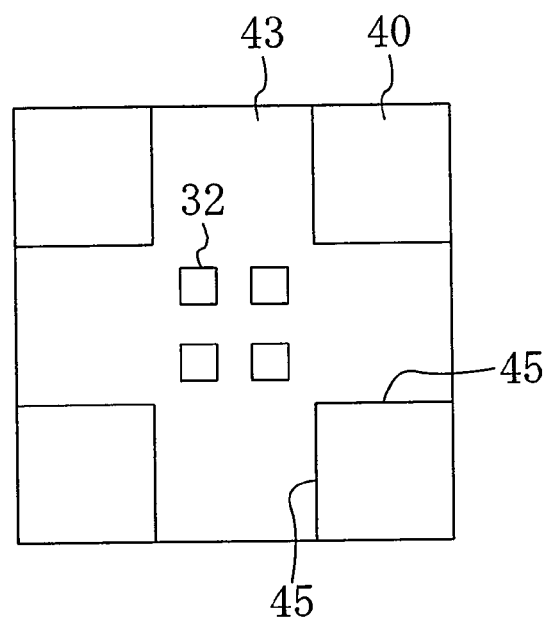
FIG. 21 is a step plan view showing a bump forming method according to an embodiment of the invention.

When the electrodes 32 are small in width and/or pitch, it is difficult to place the pillar of the wall surface 45 over the electrodes 32 or between adjacent electrodes 32. In such a case, the wall surface 45 formed on the substrate 40 may be structured as shown in FIG. 21. FIG. 21 is a plan view of the step of disposing the substrate 40 having the wall surface 45 so that the substrate 40 faces the wiring board 31.

As shown in FIG. 21, a plurality of electrodes 32 are arranged in an array (a 2 by 2 array in the figure) on the wiring board, and the wall surface 45 is formed by an inner wall of a cross-shaped recess 43 formed in the surface of the substrate 40. The substrate 40 is disposed so as to face the wiring board so that the corners of the cross-shaped recess 43 are located near the electrodes arranged at the corners of the array (all of the four electrodes in the case of the 2 by 2 array).

By disposing the substrate 40 by this method, the corners of the wall surface 45 can be placed near the electrodes 32, whereby a meniscus of the fluid 14 can be formed at the corners of the wall surface 45. Accordingly, even when the electrodes 33 are small in size and/or pitch, the self-assembling property of the fluid 14 can be improved. This method is effective in the case where a fine chip having, for example, an electrode width of 75 μm or less and an electrode pitch of 150 μm or less is mounted on the wiring board 31. Note that an optimal content of conductive particles 16 in the process of this embodiment can be set, for example, as follows:

Provided that all the conductive particles 16 contained in the volume (VB) of the fluid (for example, resin) 14 supplied onto the wiring board 31 contribute to formation of the bumps 19 on the electrodes 32 of the wiring board 31, the relation between the total volume (VA) of the bumps 19 and the volume (VB) of the fluid 14 is shown by the following formula (1):

$$VA:VB \approx SA:SB \tag{1}$$

In this formula, SA indicates the total area of the electrodes 32 on the wiring board 31 and SB indicates the area of a predetermined region (more specifically, the above-described first region 17) of the wiring board 31. The content of conductive particles 16 in the resin 14 can thus be shown by the following formula (2):

$$\text{(The content of conductive particles 16)} = SA/SB \times 100 \text{ [volume \%]} \tag{2}$$

Accordingly, the optimal content of conductive particles 16 in the resin 14 can be generally set based on the following formula (3):

$$\text{(The content of conductive particles 16)} = (SA/SB \times 100) \pm a \text{ [volume \%]} \tag{3}$$

Note that the above parameter (±a) is provided to adjust the excess and shortage at the time the conductive particles 16 are self-assembled on the electrodes 32 of the wiring board 31, and can be determined by various conditions.

Figure 22:
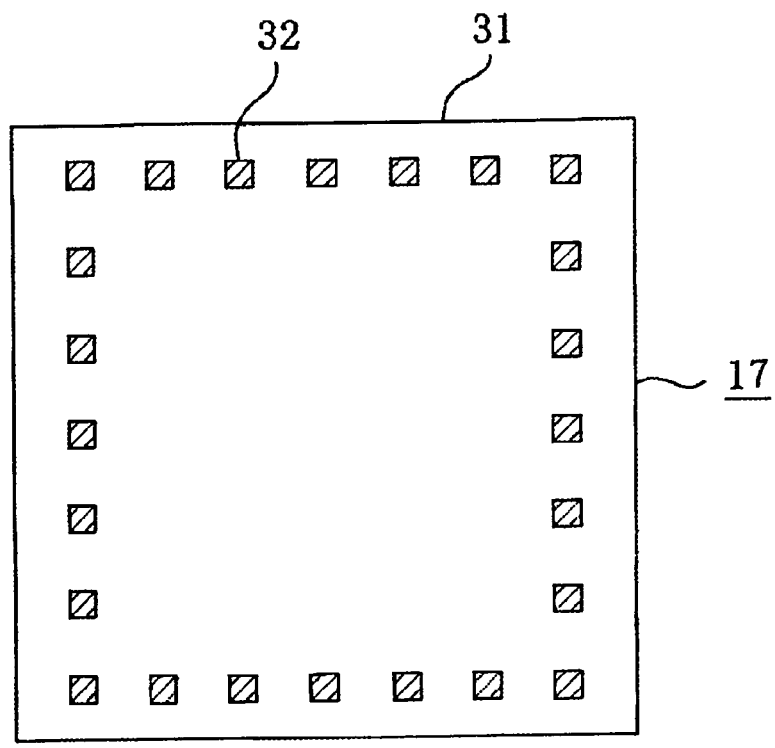
FIG. 22 is a plan view showing peripheral arrangement of electrodes.
Figure 23:
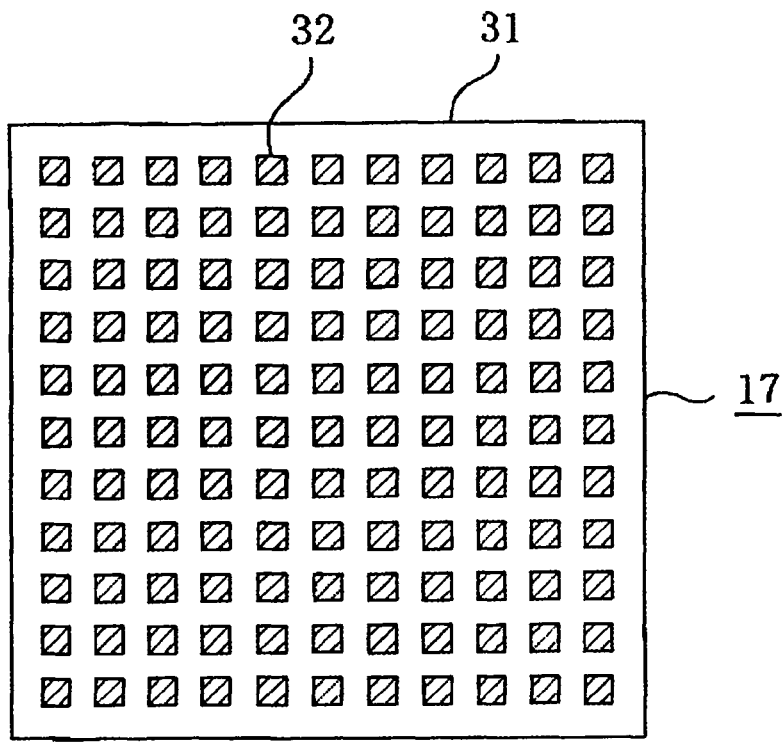
FIG. 23 is a plan view showing area array arrangement of electrodes.

Although the electrodes 32 of the wiring board 31 can be arranged in various forms, the optimal content of conductive particles 16 in the typical arrangements of the electrodes 32 as shown in FIGS. 22 and 23 can be generally obtained as follows according to the formula (3):

The arrangement of FIG. 22 (peripheral arrangement) . . . 0.5 to 5 volume %; and The arrangement of FIG. 23 (area array arrangement) . . . 15 to 30 volume %.

It can be seen from the above result that, in order to from required bumps 19 on the electrodes 32, 0.5 to 30 volume % is enough as a content of the conductive particles 16 dispersed in the resin 14.

Especially in the bump forming method of this embodiment, the fluid 14 can be retained on the first region 17 by the interfacial tension by using the substrate 40 having the wall surface 13 formed thereon. The fluid 14 can therefore be prevented from moving beyond the first region 17 into a region other than the first region 17. As a result, the amount of conductive particles 16 can be suppressed to a more efficient amount. In other words, the conductive particles 16 that are going to be lost as they move beyond the first region 17 (in other words, excessive conductive particles 16) need not be considered or the proportion of considering such conductive particles 16 can be reduced.

Note that, since the weight ratio of the conductive particles 16 to the resin 14 is generally about 7, 0.5 to 30 volume % as described above approximately corresponds to 4 to 75 weight %.

Figure 24:
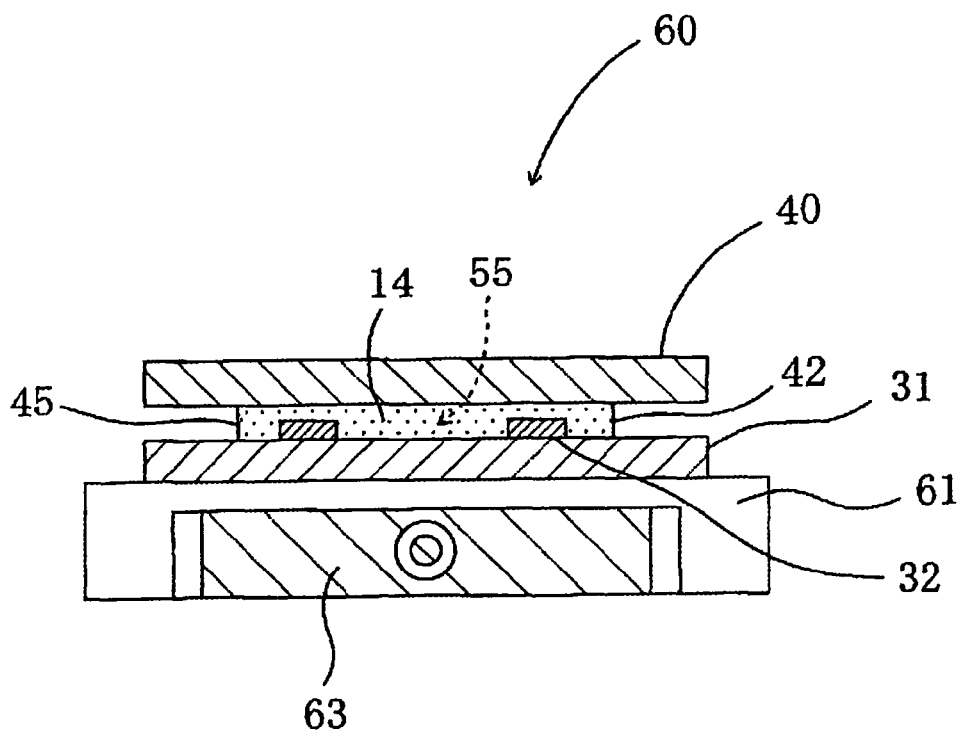
FIG. 24 is a cross-sectional view showing a structure of a bump forming apparatus according to an embodiment of the invention.

FIG. 24 shows a preferred bump forming apparatus for performing the bump forming method of this embodiment.

The bump forming apparatus of FIG. 24 is formed by a stage 61 on which a wiring board 31 is to be placed, and a substrate 40 that is disposed so as to face the stage 61. A protrusion 42 to be brought into contact with the wiring board 31 is formed on the bottom surface of the substrate 40, and the protrusion 42 has a wall surface 45. A meniscus 55 of the fluid 14 is formed by the wall surface 45 formed on the substrate 40.

In this forming apparatus 60, a fluid 14 containing conductive particles 16 and a gas bubble generating agent is supplied between the wiring board 31 placed on the stage 61 and the substrate 40 disposed so as to face the stage 61. In the structure of this embodiment, the substrate (plate-like member) 40 having the wall surface 45 is detachable. Note that the forming apparatus 60 may include a supplying machine capable of supplying the fluid 14. After the fluid 14 is supplied, the fluid 14 is heated, whereby gas bubbles are generated from the gas bubble generating agent contained in the fluid 14. A heater may be mounted on the stage 61 so that heating of the fluid 14 can be performed by the heater. Alternatively, heating of the fluid 14 may be performed by heating the substrate 40 by a heater. In the example of FIG. 24, a heater 63 is mounted under the stage 61.

The fluid 14, the conductive particles 16, and the gas bubble generating agent used in this embodiment are not specifically limited, but the following materials can be used:

Any material having an approximately flowable viscosity in the range from room temperature to the melting temperature of the conductive particles 16 may be used as the fluid 14. A material whose viscosity is reduced to a flowable value by heating is also included. Typical examples include: thermosetting resins such as epoxy resin, phenol resin, silicone resin, diallyl phthalate resin, furan resin, and melamine resin; thermoplastic resins such as polyester elastomer, fluororesin, polyimide resin, polyamide resin, and aramid resin; or photocurable (ultraviolet curable) resins; and combinations thereof. A high-boiling solvent, oil, and the like may be used in addition to the resins.

The materials shown in FIGS. 25 and 26 may be combined as appropriate for use as the conductive particles 16 and the gas bubble generating agent. Note that, when the conductive particles 16 are made of a material having a melting point higher than a boiling point of the gas bubble generating agent, the fluid 14 can be first heated so that gas bubbles are generated from the gas bubble generating agent and the fluid is self-assembled, and then the fluid 14 can further be heated so that the conductive particles in the self-assembled fluid are melted and metal-bonded to each other.

The gas bubble generating agent may be made of two or more kinds of materials having different boiling points. Different boiling points provide a difference in timing of generation and growth of the gas bubbles. As a result, the fluid 14 are pushed out stepwise by the growth of the gas bubbles, resulting in a uniform self-assembling process of the fluid 14. A uniform conductive pattern can thus be formed.

Note that, as the gas bubble generating agent, a material that is thermally decomposed to generate gas bubbles upon heating of the fluid 14 may be used in addition to the materials shown in FIG. 26. The materials shown in FIG. 27 may be used as such a gas bubble generating agent. For example, a compound containing water of crystallization (aluminum hydroxide) is thermally decomposed upon heating of the fluid 14, and water vapor is generated as gas bubbles.

It should be understood that, although the invention has been described using the preferred embodiments, such description is not a restrictive matter and various modifications can be made. For example, the process of causing the fluid 14 to be self-assembled between the protrusion 42 and the electrodes 32 of the wiring board 31 may be performed while varying the gap between the protrusion 42 and the wiring board 31. This enables the fluid 14 to be efficiently self-assembled between the protrusion 42 and the electrodes 32.

Industrial Applicability

According to the invention, a method for selectively forming bumps by a simple method can be provided.

The invention claimed is:

1. A method for forming bumps on a plurality of electrodes of a wiring board, comprising the steps of:
   (a) supplying a resin containing conductive particles and a gas bubble generating agent onto a first region so as to contiguously cover the plurality of electrodes on the wiring board;
   (b) then disposing a substrate having a wall surface perpendicular to a surface of the electrodes in direct contact with the wiring board and formed near a periphery of the electrodes so that the substrate faces the wiring board;
   (c) heating the resin to a temperature sufficient to generate gas bubbles from the gas bubble generating agent, the temperature being such that the conductive particles are not melted, to self-assemble the resin on the entire surfaces of the electrodes by the gas bubbles generated from the gas bubble generating agent; and
   after the step (c), (d) heating the resin at a temperature at which the conductive particles are melted to melt the conductive particles contained in the resin self-assembled on the electrodes, thereby forming the bumps on the entire surface opposite the wiring board of the electrodes.

2. The bump forming method according to claim 1, wherein, in the step (b), the resin supplied onto the first region is in contact with the wall surface to form a meniscus.

3. The bump forming method according to claim 1, wherein, in the step (a), the first region to which the resin is supplied is a partial region of the wiring board.

4. The bump forming method according to claim 1, wherein the substrate has a protrusion formed on a surface facing the wiring board, and the wall surface is present on at least a part of a side surface of the protrusion.

5. The bump forming method according to claim 1, wherein the substrate has a recess formed in a surface facing the wiring board, and the wall surface is an inner wall of the recess.

6. The bump forming method according to claim 5, wherein the recess has a bottom surface adjacent to the inner wall, and in the step (b), the resin is in contact with the wall surface and the bottom surface.

7. The bump forming method according to claim 1, wherein the substrate is formed by a wall-surface forming member including the wall surface, and a ceiling member extending approximately perpendicularly from the wall surface of the wall-surface forming member.

8. The bump forming method according to claim 7, wherein the ceiling member is slidable along the wall surface of the wall-surface forming member, and at least one of the steps (b) and (c) includes the step of varying a gap between the ceiling member and the wiring board.

9. The bump forming method according to claim 1, wherein the wall surface has a pillar shape on the substrate, and in the step (b), the substrate is disposed so as to face the wiring board so that the pillar-shaped wall surface is positioned over the electrodes.

10. The bump forming method according to claim 9, wherein the pillar-shaped wall surface has a smaller width than that of the electrodes.

11. The bump forming method according to claim 9, wherein the plurality of electrodes are arranged in an array on the wiring board, a plurality of pillar-shaped wall surfaces are formed in an array on the substrate, and in the step (b), the substrate is disposed so as to face the wiring board so that the wall surfaces formed in the array are respectively positioned over the electrodes.

12. The bump forming method according to claim 9, further comprising the steps of: (e) removing the substrate after the step (d); and (f) remelting the bumps formed on the electrodes.

13. The bump forming method according to claim 1, wherein the plurality of electrodes are arranged on the wiring board, the wall surface has a pillar shape on the substrate, and in the step (b), the substrate is disposed so as to face the wiring board so that the wall surface is positioned between adjacent electrodes.

14. The bump forming method according to claim 13, wherein the plurality of electrodes are arranged in an array on the wiring board, the wall surface has a grid-like shape on the substrate, and in the step (b), the substrate is disposed so as to face the wiring board so that the wall surface surrounds a periphery of each electrode.

15. The bump forming method according to claim 1, wherein the plurality of electrodes are arranged in an array on the wiring board, the wall surface is formed by an inner surface of a cross-shaped recess formed in a surface of the substrate, and in the step (b), the substrate is disposed so as to face the wiring board so that corners of the cross-shaped recess are positioned near the electrodes arranged at corners of the array.

16. The bump forming method according to claim 1, wherein the substrate is a light-transmitting substrate.

17. The bump forming method according to claim 1, wherein the substrate is a substrate having poor wettability to the conductive particles.

18. The bump forming method according to claim 1, wherein the gas bubble generating agent contained in the resin is made of a material that boils or a material that is thermally decomposed to generate a gas when the resin is heated in the step (c).

19. The bump forming method according to claim 1, wherein, in the step (c), the gas bubbles generated from the gas bubble generating agent are discharged to outside from a periphery of a space provided between the substrate and the wiring board.

20. The bump forming method according to claim 1, further comprising the step of removing the substrate after the step (d).

* * * * *